(12) United States Patent
Smith

(10) Patent No.: US 6,437,240 B2
(45) Date of Patent: Aug. 20, 2002

(54) MICROELECTRONIC CONNECTIONS WITH LIQUID CONDUCTIVE ELEMENTS

(75) Inventor: John W. Smith, Palo Alto, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/757,897

(22) Filed: Jan. 10, 2001

Related U.S. Application Data

(60) Division of application No. 08/962,693, filed on Nov. 3, 1997, which is a continuation-in-part of application No. 08/641,698, filed on May 2, 1996, now Pat. No. 5,808,874.

(51) Int. Cl.[7] .......................... H01L 23/28; H01L 23/34
(52) U.S. Cl. ...................... 174/52.2; 361/709; 361/717; 257/706; 257/707
(58) Field of Search ............................. 174/52.2, 52.3, 174/52.4; 361/704, 707, 709, 717, 718, 719, 720, 749; 257/706, 707, 712, 713, 737, 738

(56) References Cited

U.S. PATENT DOCUMENTS

| | | |
|---|---|---|
| 2,734,154 A | 2/1956 | Pankove |
| 4,034,468 A | 7/1977 | Koopman ..................... 29/628 |
| 4,034,469 A | 7/1977 | Koopman et al. ............ 29/628 |
| 4,233,645 A * | 11/1980 | Balderes et al. ............. 361/385 |
| 4,254,431 A | 3/1981 | Babuka et al. ................ 357/82 |
| 4,299,715 A | 11/1981 | Whitfield et al. ............. 252/74 |
| 4,323,914 A | 4/1982 | Berndlmaier et al. ......... 357/82 |
| 4,398,975 A | 8/1983 | Ohsawa et al. ............. 148/400 |
| 4,435,611 A | 3/1984 | Ohsawa et al. ............ 174/68.5 |
| 4,466,483 A | 8/1984 | Whitfield et al. ........... 165/185 |
| 4,473,113 A | 9/1984 | Whitfield et al. ........... 165/185 |
| 4,607,277 A | 8/1986 | Hassan et al. ................ 357/81 |
| 4,806,111 A | 2/1989 | Nishi et al. .................. 439/109 |
| 4,915,167 A | 4/1990 | Altoz .......................... 165/185 |
| 4,966,142 A | 10/1990 | Zimmerman et al. ....... 228/263 |

(List continued on next page.)

FOREIGN PATENT DOCUMENTS

| | | |
|---|---|---|
| SU | 586519 | 6/1976 |
| WO | WO 96/02068 | 1/1996 |

OTHER PUBLICATIONS

Thermally-Enhanced Tape Automated Bonded Package, IBM Technical Disclosure Bulletin, vol. 31, No. 5, Oct. 1988.

(List continued on next page.)

Primary Examiner—Dean A. Reichard
Assistant Examiner—Carmelo Oliva
(74) Attorney, Agent, or Firm—Lerner, David, Littenberg, Krumholz & Mentlik, LLP

(57) ABSTRACT

A method of making a microelectronic assembly includes providing a first microelectronic element and a second microelectronic element with confronting, spaced-apart surfaces defining a space therebetween and providing one or more masses of a fusible conductive material having a melting temperature below about 150° C. in said space, whereby the fusible conductive masses connect the first and second microelectronic elements to one another. Next, a flowable material is introduced between the confronting surfaces of the first and second microelectronic elements and around the one or more fusible conductive masses and the flowable material is then cured to provide a compliant layer disposed between said confronting surfaces and intimately surrounding each fusible conductive mass. The fusible conductive masses are capable of electrically interconnecting the contacts on microelectronic elements confronting one another and/or conducting heat between confronting microelectronic elements.

8 Claims, 11 Drawing Sheets

U.S. PATENT DOCUMENTS

| | | | |
|---|---|---|---|
| 5,011,787 A | 4/1991 | Jeuch | 437/52 |
| 5,031,308 A | 7/1991 | Yamashita et al. | 29/830 |
| 5,037,312 A | 8/1991 | Casciotti et al. | 439/66 |
| 5,056,706 A | 10/1991 | Dolbear et al. | 228/180.2 |
| 5,071,787 A | 12/1991 | Mori et al. | 437/183 |
| 5,074,947 A | 12/1991 | Estes et al. | 156/307.1 |
| 5,086,558 A | 2/1992 | Grube et al. | 29/832 |
| 5,097,387 A | 3/1992 | Griffith | 361/385 |
| 5,131,582 A | 7/1992 | Kaplan et al. | 228/121 |
| 5,148,141 A | 9/1992 | Suurinen | 337/297 |
| 5,148,265 A | 9/1992 | Khandros et al. | 357/80 |
| 5,148,266 A | 9/1992 | Khandros et al. | 357/80 |
| 5,164,566 A | 11/1992 | Spletter et al. | 219/121.63 |
| 5,170,930 A | 12/1992 | Dolbear et al. | 228/123 |
| 5,196,371 A | 3/1993 | Kuleza et al. | 437/183 |
| 5,198,189 A | 3/1993 | Booth et al. | 420/555 |
| 5,223,747 A | 6/1993 | Tschulena | 257/713 |
| 5,237,130 A | 8/1993 | Kuleza et al. | 174/260 |
| 5,323,265 A | 6/1994 | Turlik et al. | 361/702 |
| 5,323,294 A | 6/1994 | Layton et al. | 361/699 |
| 5,328,087 A | 7/1994 | Nelson et al. | 228/175 |
| 5,367,435 A * | 11/1994 | Andros et al. | 361/749 |
| 5,410,449 A * | 4/1995 | Brunner | 361/719 |
| 5,445,308 A | 8/1995 | Nelson et al. | 228/121 |
| 5,455,390 A | 10/1995 | DiStefano et al. | 174/262 |
| 5,459,352 A | 10/1995 | Layton et al. | 257/724 |
| 5,542,602 A | 8/1996 | Gaynes et al. | 228/121 |
| 5,553,769 A | 9/1996 | Ellerson et al. | 228/123.1 |
| 5,557,501 A | 9/1996 | DiStefano et al. | 361/704 |
| 5,561,590 A | 10/1996 | Norell et al. | 361/699 |
| 5,572,404 A | 11/1996 | Layton et al. | 361/699 |
| 5,611,884 A * | 3/1997 | Bearinger et al. | 156/325 |
| 5,651,179 A | 7/1997 | Bessho et al. | 29/832 |
| 5,658,831 A | 8/1997 | Layton et al. | |
| 5,688,721 A | 11/1997 | Johnson | 437/203 |
| 5,720,100 A | 2/1998 | Skipor et al. | 29/840 |
| 5,745,344 A * | 4/1998 | Baska et al. | 361/705 |
| 5,808,874 A | 9/1998 | Smith | 361/769 |
| 5,819,406 A | 10/1998 | Yoshizawa et al. | 29/877 |
| 5,920,125 A | 7/1999 | Ellerson et al. | 257/778 |
| 5,975,408 A | 11/1999 | Goossen | 228/173.2 |
| 6,000,127 A | 12/1999 | Eifuku et al. | 29/840 |

OTHER PUBLICATIONS

Hard Gallium Alloys For Use As Low Contact Resistance Electrodes and For Bonding Thermocouples Into Samples, George G. Harman, Electron Devices Section, National Bureau of Standards, Washington D.C., The Review of Scientific Instruments, vol. 31, No. 7, Jul. 1960.

Circuit Module With Gallium Metal Cooling Structure, D.A. Jeannotte, IBM Technical Disclosure Bulletin, vol. 19, No. 4, Sep. 1976.

A New Face Down Bonding Technique Using a Low Melting Point Metal, Mori, et al., IEEE Transactions on Components, Hybrids, and Manufacturing Technology, vol. 13, No. 2, Jun., 1990.

TBGA Package Technology, Frank E. Andros and Richard B. Hammer, IEEE Transactions On Components, Packaging and Manufacturing Technology, Part B, vol. 17, No. 4, Nov. 1994.

Liquid Interconnects For Fine PItch Assembly? Electronic Packaging & Production, vol. 29, No. 6, Jun. 1989.

* cited by examiner

MICROELECTRONIC CONNECTIONS WITH LIQUID CONDUCTIVE ELEMENTS

This application is a divisional application of application Ser. No. 08/962,693 filed on Nov. 3, 1997, which is a continuation-in-part of application Ser. No. 08/641,698 filed on May 2, 1996, now U.S. Pat. No. 5,808,874, the disclosure of which is incorporated herein by reference.

FIELD OF THE INVENTION

The present invention relates to mounting and connection devices and techniques for use with microelectronic elements such as semiconductor chips.

BACKGROUND OF THE INVENTION

Complex microelectronic devices such as semiconductor chips require numerous connections to other electronic components. Typically, the microelectronic devices are mounted on substrates or external circuit elements, such as printed circuit boards, having electrical contacts, and the contacts on the chip are electrically connected to the contacts of the external circuit element. The external circuit element may have pins or other connectors adapted to accommodate other components, including additional semiconductor chips. Also, the external circuit element may have pins or other connectors adapted to connect the contacts or internal circuitry of the external circuit element to a larger assembly, thereby connecting the chip to the larger assembly.

Connections between microelectronic elements and substrates must meet several demanding and often conflicting requirements. They must provide reliable, low-impedance electrical interconnections. They must also withstand stresses caused by thermal effects during manufacturing processes such as soldering. Other thermal effects occur during operation of the device. As the system operates, it evolves heat and the components of the system, including the chip and the substrate expand. When operation ceases, the components cool and contract. When the assembly is heated and cooled during manufacture or in operation, the chip and the substrate expand and contract at different rates, so that portions of the chip and substrate move relative to one another. Also, the chip and the substrate can warp as they are heated and cooled, causing further movement of the chip relative to the substrate. These and other effects cause repeated strain on electrical elements connecting the chip and the substrate. The interconnection system should withstand repeated thermal cycling without breakage of the electrical connections. The interconnection system should provide a compact assembly, and should be suitable for use with components having closely-spaced contacts. Moreover, the interconnection should be economical.

Various solutions have been proposed to meet these needs. In particular, as disclosed in U.S. Pat. Nos. 5,148,265; 5,148,266; 5,455,390 and in International Publication WO 96/02068, flexible leads may be provided between the contacts on a chip or other microelectronic element and the contact pads of a substrate. According to preferred embodiments taught in these documents, a compliant layer, such as an elastomer or a gel may be provided between the chip and the substrate. Flexible leads connecting the chip and substrate may extend through the compliant layer. In these preferred arrangements, the chip is mechanically decoupled from the substrate, so that the chip and substrate can expand and move independently of one another without excessive stress on the electrical connections between the chip contacts and the contact pads of the substrate. Moreover, the assemblies disclosed in these patents and publications meet the other requirements discussed above. In certain preferred embodiments according to these documents, the chip and the interconnections to the substrate can occupy an area of the substrate about the same size as the chip itself.

Microelectronic elements such as semiconductor chips generate considerable amounts of heat during use. For example, a complex, high-speed chip only a few centimeters square in area may produce tens of watts of heat. This heat must be dissipated to maintain the chip at a safe operating temperature. Improvements in chip mountings and electrical connections, and in related assembly methods, have made it possible to reduce the distance between chips so as to achieve a more compact assembly. Such assemblies, typically referred to as "multichip modules," incorporate one or more substrates with chips disposed close to one another on the substrate. The heat dissipation problems discussed above are particularly extreme in such compact multichip modules.

Considerable effort has been devoted in the art towards meeting these needs for cooling. A general outline of the approaches taken heretofore is set forth in the text Multichip Module Technologies and Alternatives—The Basics, Doane, D. A. and Franzon, P. D., EDS 1993 Van Nostrand Reinhold, New York, N.Y. at chapter 12, pp. 569–613, entitled "Thermal Design Considerations For Multichip Module Applications" (Azar, K., chapter author) and at pages 109–111 of the same reference. As described therein, heat transfer problems in electronic packaging can be addressed in terms of "thermal resistance" of the elements involved. The thermal resistance of any element in the heat transfer path refers to the ratio between the temperature difference across such element and the rate of heat flow through the element. Thermal insulators have high thermal resistance whereas elements which convey heat effectively by conduction or convection have low thermal resistance. The overall thermal resistance of the package is the sum of the individual thermal resistances in series in the heat path between the chip and the ambient environment. The overall thermal resistance in turn provides a ratio between the temperature rise of the chips above ambient temperature and the amount of heat produced in the chips.

As described in the aforementioned reference, the heat conduction pathway may include an element commonly referred to as a "heat sink." There is normally a low thermal resistance connection from the heat sink to the environment. For example, the vanes of the heat sink may be bathed in a flow of forced air or liquid. However, there is generally an appreciable thermal resistance between the semiconductor chip, or other microelectronic components, and the heat sink. Stated another way, it is difficult to provide a low thermal resistance connection between the chip and the heat sink while still meeting all of the other requirements for such a connection. This is because the thermal connection must accommodate relative movement between the chips or other components and the heat sink during use of the device. Such relative movement arises in part from movement of the components and the substrate bearing the components as the assembly undergoes temperature changes during use. When the unit is first supplied with power, the temperature of the chips or other components rises faster than the temperature of the substrate, causing differential thermal expansion, warpage and distortion. Further, the coefficients of thermal expansion of the chips and the substrate normally are not matched with the coefficient of thermal expansion of the heat sink, causing further differential thermal expansion and contraction.

Moreover, the connection between the components and the heat sink should accommodate dimensional tolerances in the components, the substrate and the heat sink itself. For example, the chips themselves may be of different thicknesses. Also, the chips can be supported at different levels above the face of the substrate by solder balls or other mountings. The surfaces of the chips may be tilted from their nominal positions, so that the chip surfaces are out of alignment with the surface of the heat sink. The heat sink itself may not be perfectly flat or parallel to the nominal plane of the chip surfaces. Any elements used to connect the heat sink with the chip or the components should be capable of accommodating these tolerances and misalignments. Considerable efforts have been made in the art heretofore towards satisfying these requirements.

Nonetheless, still further improvement would be desirable. For example, it would be desirable to provide additional connection components and methods which provide effective mechanical decoupling and high resistance to thermally induced stresses, while also providing low cost and high reliability. It would also be desirable to provide a microelectronic package including improved assemblies and methods for dissipating heat therefrom to minimize thermally induced stresses, while also providing high reliability and low cost.

SUMMARY OF THE INVENTION

One aspect of the present invention provides a method of making a microelectronic assembly including the steps of providing a first microelectronic element, such as a semiconductor chip and a second microelectronic element with confronting spaced-apart surfaces defining a space therebetween and providing one or more masses of a fusible conductive material having a melting temperature below about 150° C. in the space. Next, a flowable liquid material, typically a liquid, is introduced between the confronting surfaces of the first and second microelectronic elements and around the one or more fusible conductive masses. The flowable material is then cured to form a compliant layer disposed between the confronting surfaces of the first and second microelectronic elements and surrounding each of the fusible conductive masses. The one or more conductive masses may be maintained in a substantially solid condition or in a substantially liquid condition when the flowable material is introduced. The fusible conductive masses may also be maintained in either a substantially solid condition or in a substantially liquid condition during the curing step.

The first microelectronic element preferably is a circuit element such as a semiconductor chip. The second microelectronic element may be a further circuit element such as a dielectric element having conductors thereon, or else may be a package element such as a casing, heat spreader or heat sink. The conductive material is thermally conductive, electrically conductive or both. Where the second microelectronic element is a circuit element, the method desirably includes the step of electrically connecting the first and second elements to one another. For example, the step of providing the masses of fusible conductive material may be performed so that the masses extend between contacts on the confronting surfaces of the first and second microelectronic element, so that the masses electrically interconnect the first and second elements. The conductive masses desirably provide a thermal conduction path between the first and second microelectronic elements. Preferably, the one or more fusible conductive masses are contiguous with both elements, and connect the first and second microelectronic elements to one another.

Preferably, the fusible conductive masses are contiguous with and are contained by the compliant material, so that the conductive material remains in place when in a liquid state. Thus, the compliant layer keeps the fusible conductive masses separate and electrically insulated from one another. Alternatively or additionally, a polymer coating such as a polyparaxylene coating may be provided over the fusible conductive masses. The polyparaxylene coating is a conformal coating which preferably fully encompasses the fusible conductive masses and desirably extends to the neighboring portions of the confronting surfaces of the first and second microelectronic elements. The coating enhances the electrical isolation of the fusible conductive masses and also protects the masses from contamination, e.g. prevents the fusible conductive material and the compliant layer from diffusing into one another. The polyparaxylene coating can also aid in maintaining the masses in place when the masses are in the liquid state.

In additional preferred methods according to this aspect of the invention, the step of providing said first and second elements being performed so that said second microelectronic element confronts a front surface of the first microelectronic element and these elements define a front space therebetween, the conductive masses being provided in said front space. A third microelectronic element is provided so that this element confront a rear surface. Thus, the first and third microelectronic elements define a rear space between said rear surface and said third microelectronic element. The first microelectronic element is sandwiched between the second and third microelectronic elements, with front and rear spaces on opposite sides of the first microelectronic element. Methods according to this aspect of the invention desirably include the step of disposing one or more additional fusible conductive masses in the rear space and introducing additional flowable material into said rear space and around said conductive masses in said rear space. Most preferably, this additional flowable material is cured to form a rear compliant layer between the third microelectronic element and said first microelectronic element, said rear compliant layer intimately surrounding said conductive masses in said rear space. The step of introducing a flowable material into the rear space, and the step of introducing a flowable material into the front space can be preformed by simultaneously using a single flowable material.

A related aspect of the invention provides a microelectronic package comprising a first microelectronic element such as a semiconductor chip operable in a range of operating temperatures. The chip or other microelectronic element has a front face including contacts and a rear surface. A compliant layer is disposed between the confronting surfaces of the first microelectronic element and the package element. Masses of a fusible, thermally conductive material having a melting temperature within or below the range of operating temperatures of the first microelectronic element are also provided between the package element and the first microelectronic element. Each such mass extends adjacent to the confronting surfaces of the first microelectronic element and the package element for transferring heat therebetween during operation of the microelectronic package. The package may also include a second microelectronic element such as a circuit element electrically connected to the first microelectronic element, most preferably a flexible dielectric sheet with terminals thereon, overlying the front face of the first microelectronic element or chip. A compliant layer most preferably is provided between the front face and the second microelectronic element. Here again, masses of a fusible conductive material, preferably a material capable of conducting both electrical signals and heat, are dispersed in the second compliant layer so that the fusible conductive masses are spaced apart from one another in lateral directions parallel to the surfaces of the microelectronic elements. These masses may be disposed between the opposing contacts on the first microelectronic element and the second microelectronic element for electrically interconnecting the first and second microelectronic elements. In the final package the first and second compliant layers are preferably contiguous with one another. The package mechanically isolates the first microelectronic element or chip and effectively decouples it from mechanical stresses and differential thermal expansion, while also providing effective heat transfer from the chip and effective interconnection between the chip and external circuitry.

The masses of the fusible conductive material used in various aspects of the invention may comprise one or more metals or may comprise a metal alloy and are preferably capable of conducting electrical signals, heat or both. The fusible conductive material preferably has a melting temperature below about 125° C., and in more preferred embodiments the fusible conductive material has a melting temperature below about 65° C. Most preferably the fusible conductive material has a melting temperature between about 25° C. and about 65° C. However, lower melting temperatures can be employed if the production process is altered to accommodate the lower melting temperature. The conductive masses preferably are liquid at temperatures within the range of temperatures encountered during normal operation of microelectronic elements, and may have a melting temperature below the range of operating temperatures of the microelectronic elements. The fusible conductive masses may be in a solid state or a liquid state when the assembly is inactive; however, during operation, the fusible conductive masses may be wholly or partially liquid so that essentially no forces will be transmitted between the microelectronic elements through the conductive masses. Stated another way, the conductive masses in their liquid state have spring constants at or close to zero and do not resist movement of the microelectronic elements relative to one another. Alternatively, the conductive material may be a fusible material which melts at temperatures slightly above the range of temperatures encountered during normal operation. In this case, the assembly relieves mechanical stress in the electrical connections or thermal connections, and repairs defects in the connections, when the assembly is exposed to high temperatures during abnormal operating conditions or during processing operations.

Preferably, the compliant dielectric layer also allows the microelectronic elements to move relative to one another. Thus, the dielectric layer desirably is formed from an elastomer, gel, foam or other material having relatively low resistance to deformation. Preferred assemblies according to the present invention thus allow electrical signals to pass between microelectronic elements through the fusible conductive masses. In addition, preferred assemblies according to the present invention also allow heat generated by the microelectronic elements to be effectively dissipated through the package and allow the confronting faces of the microelectronic elements to move relative to one another to compensate for movement and distortion during thermal cycling of the package. The compliant connection between the microelectronic elements also helps to compensate for tolerances encountered during manufacturing and can be provided even where each conductor has substantial cross-sectional area. Thus, low resistance, low impedance conductors can be utilized without impairing the flexible connection. Moreover, when the fusible material melts, cracks or other defects in the conductive masses are repaired.

One or more of the microelectronic elements may include a flexible dielectric sheet having an exterior surface facing away from the other elements and having conductive terminals accessible at the exterior surface. Thus, where the first microelectronic element includes a semiconductor chip, the second element may include a flexible dielectric sheet overlying a surface of the chip and having terminals facing away from the surface of the chip. Thus, the front space lies between the flexible sheet and the chip contact bearing face of the chip. The method may further include the step of forcing the terminals into substantially coplanar disposition while maintaining the masses of fusible conductive material in an at least partially molten condition. Preferably, this step is performed prior to curing the flowable material, either before or after introduction of the flowable material into the space. After the conductive masses have been provided between the confronting surfaces of the chip and the dielectric sheet, the conductive terminals are forced into substantially coplanar alignment with one another as the flowable material is introduced therebetween and the conductive masses are allowed to freeze. Alternatively, the flowable material is introduced between the confronting surfaces before the conductive terminals are forced into substantially coplanar alignment. In certain preferred methods according to this aspect of the invention, the flexible sheet and the chip or other element have contacts on their opposing surfaces. Fusible conductive masses are provided between the opposing contacts to electrically interconnect the chip and the dielectric sheet. Additional fusible conductive masses, aside from those used for electrical interconnection, may be provided between the confronting faces of the chip and the dielectric sheet to provide additional conduct heat therebetween. In an alternative embodiment, the dielectric sheet includes conductive terminals accessible at the exterior surface and flexible leads are used to connect the conductive terminals of the dielectric sheet with the contacts of the semiconductor chip. Fusible conductive masses are provided between the confronting faces of the chip and the dielectric sheet for conducting heat therebetween during operation.

In methods according to further aspects of the invention, one or more of the microelectronic elements may include a plurality of semiconductor chips. For example, the first microelectronic element may include a unitary wafer incorporating a plurality of semiconductor chips, whereas the second microelectronic element may include a flexible dielectric sheet as described above. Each chip is preferably aligned with a portion of the sheet and the contacts on each chip may be connected by the fusible conductive masses to the terminals in the aligned portion of the sheet. The method according to this aspect of the invention may include the further step of severing individual portions of the sheet and wafer to form individual units, each including one or more chips and the portion of the sheet aligned therewith. The step of providing the microelectronic elements and the fusible conductive masses may include the step of providing the masses attached to contacts on one of the microelectronic elements and then juxtaposing the elements with one another and at least partially melting the masses to thereby bond the masses to the contacts on the other element. For example, where one of the elements is a wafer, the masses may be provided on the wafer, and the wafer may be juxtaposed with the flexible dielectric sheet. In methods according to a further aspect of the invention, the second microelectronic element has electrically conductive traces thereon, and a plurality of chips are electrically connected to the second element, as by connection through conductive masses as discussed above, so that the chips are interconnected to one another to form a multichip module.

Further methods of making a microelectronic assemblies according to the invention include the steps of providing a metallic plate, juxtaposing the plate with a surface of a microelectronic element and providing one or more masses of a fusible conductive material so that the masses extend in a space between the plate and the microelectronic element, and preferably extend all the way from the plate to the microelectronic element. In a particularly preferred arrangement, the plate is provided with the more masses of a fusible conductive material disposed at predetermined locations on a surface thereof before juxtaposing the plate with the microelectronic element. Methods according to this aspect of the invention desirably include the step of injecting a flowable material between the metallic plate and the microelectronic element and curing the flowable material to form a compliant dielectric layer which intimately surrounds the fusible conductive masses. The predictable, isotropic thermal expansion properties of the metallic plate help to provide precise alignment of the fusible conductive masses with the contacts on the microelectronic element. The metallic plate is then subdivided to form separate portions connected to separate ones of the fusible conductive masses. The microelectronic element according to this particular embodiment may include an array of semiconductor chips or a semiconductor wafer. The metallic plate may be subdivided by etching the plate after the flowable material is cured. After the metallic sheet has been subdivided, the wafer and the compliant layer may be severed to form individual units whereby each unit includes one or more chips. In certain embodiments, the metallic plate with the fusible conductive masses may be provided by forming a layer on a first side of the metallic plate whereby the layer has apertures therein and includes a material, such as a polymer, which is non-wettable by the conductive masses. The first side of the plate is then exposed to the fusible conductive masses while the conductive masses are in a molten condition so that drops of the fusible conductive masses adhere to the metallic plate at the apertures therein. The first side of the plate is preferably exposed to the conductive masses by dipping the metallic plate into a bath of the fusible conductive material. A second side of the metallic plate opposite from the first side thereof may be covered by a protective coating during the exposing step to prevent the second side of the metallic plate from coming into contact with the fusible conductive material.

Barrier layers, such as a layers of polysilicon, may be provided on surfaces of the microelectronic elements which are in contact with the fusible masses, such as on contacts or on surfaces of package elements. The barrier layer prevents the material in the fusible conductive masses from diffusing into the microelectronic element, the opposing contacts and/or the package element. The barrier metal layer also prevents contamination of the fusible material by the microelectronic element and/or the package element.

Yet a further embodiment of the invention provides structures which can be used as components in fabrication of microelectronic assemblies. A structure according to this aspect of the present invention includes a layer of a matrix material having top and bottom surfaces extending in lateral directions. One or more masses of a fusible conductive material are dispersed in the layer so that the individual conductive masses are spaced apart from one another in the lateral directions and are separated from one another by the matrix material. The fusible conductive masses preferably include one or more metals and preferably have a melting temperature below about 125° C. and more preferably below about 65° C. In certain embodiments, at least some of the fusible conductive masses extend over a major portion of the distance between the top and bottom surfaces of the layer. In still other embodiments, at least some of the fusible conductive masses extend from the top surface to the bottom surface of the layer to provide a continuous conductive path from the top surface to the bottom surface of the layer. The matrix material is selected from the group consisting of (a) compliant materials having a degradation temperature higher than the melting temperature of the fusible conductive masses and (b)flowable, curable precursor materials. This structure may be provided as a prefabricated structure, without microelectronic elements. The prefabricated structure may be used with one or more microelectronic elements to provide a compliant, thermally conductive connection, and may also be used to provide a compliant electrically conductive connection. The structure may also include one or more removable release layers overlying at least one of the surfaces of the layer of matrix material. The release layer protects the structure from contamination during storage and may be removed from the structure shortly before final assembly of the structure with a microelectronic package. The structure may also include an adhesive overlying at least one of the top and/or bottom surfaces of the matrix layer so that the structure may be easily assembled to the surface(s) of one or more microelectronic elements. Alternatively, the matrix material itself may be capable of bonding to a surface of a microelectronic element. Related aspects of the invention provide assembly methods using such components. For example, a layer as aforesaid may be assembled to one or more semiconductor chips, whereby each semiconductor chip has a surface in engagement with a surface of the layer. Thus, the layer may be applied to a surface of a wafer or to an assemblage of individual chips, and the resulting assembly may be severed to provide individual units including one or more chips and a portion of the layer.

Other objects and advantages of the present invention will be pointed out in the following detailed description and accompanying drawings.

DETAILED DESCRIPTION OF THE PREFERRED EMBODIMENTS

Figure 1:
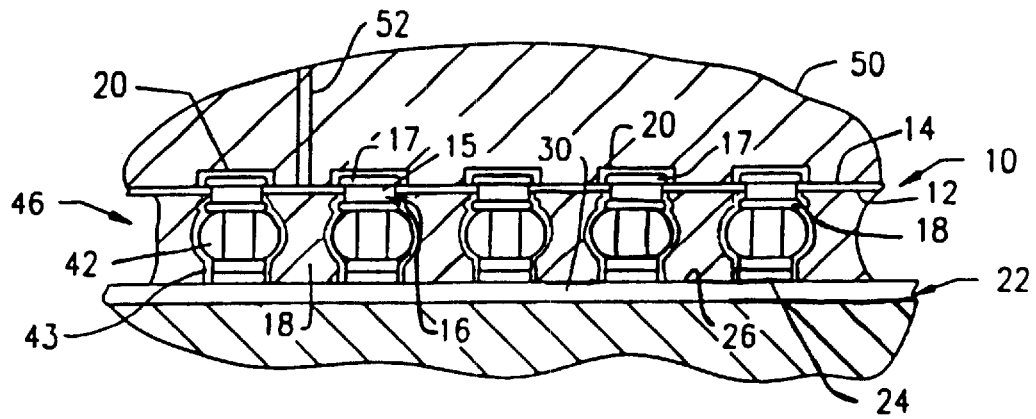
FIG. 1 is a fragmentary, diagrammatic sectional view depicting a stage in a manufacturing process according to one embodiment of the invention.

An assembly in accordance with one embodiment of the invention includes as a first element a unitary semiconductor wafer 22 incorporating a large number of semiconductor chips 28 disposed side by side. The wafer has numerous contacts 24 disposed on its top or front surface 26. A rear surface 27 is devoid of contacts. Each contact includes a small spot of a metal such as aluminum, gold, copper, zinc or tin. The wafer is formed in the normal fashion, with numerous semiconductor devices within each chip 28 connected to one another and to contacts 24 by internal circuitry (not shown) formed within the wafer. The wafer also has narrow strip-like regions 30, commonly referred to as "saw lanes" or "scribe streets" extending between adjacent chips 28.

The second element of the assembly includes a flexible, but substantially inextensible dielectric sheet 10 having a first surface 12 and a second surface 14. For example, sheet 10 may be a sheet of polyimide about 25 microns or less thick. Vias are formed through sheet 10 and filled with a metallic material to form solid via liners or terminal assemblies 15 extending through the sheet at predetermined locations. Each via liner defines a contact 16 at the first surface 12 of sheet 10 and a terminal 17 at the second surface of the sheet. The terminal assemblies 15 may be formed from any suitable metal which can be conveniently deposited in the vias as, for example, copper and copper alloys. Each contact 16 is provided with a layer 18 of a barrier material, such as a polycrystalline silicon, on the exposed face of the contact. The barrier material is selected to resist dissolution in the low-melting fusible conductive metal discussed below, and to prevent difflusion of the underlying material of the contact in the fusible metal. The composition of the barrier layer will depend in part upon the composition of the fusible metal. Metals such as nickel, tungsten, titanium and their alloys normally can be used as barrier layers with typical fusible metals such as ultra-low melting solders of the types discussed below. The barrier layer 18 may also include a polycrystalline silicon or polysilicon. Barrier layer 18 need only be thick enough to inhibit dissolution of the underlying metal in the contact 16. A layer of barrier material about 1 micron thick typically is sufficient. The barrier layer material desirably is wettable by the fusible conductive metal when the fusible conductive metal is in its liquid state. The barrier layer may also include a plurality of layers of different compositions. Terminals 17 have bonding material layers or masses 20 thereon. Essentially any conventional bonding material can be employed, including conventional solders, conductive polymers, and eutectic bonding materials, also referred to as diffusion-bonding alloys. The bonding material is selected to provide satisfactory connection to the contact pads engaged with the terminals in service, as further discussed below.

In a first step of a process according to one embodiment of the invention, masses 42 of a fusible conductive material such as an ultra-low melting point solder are deposited on the contacts 24 of wafer 22. This step of the process may be performed by conventional equipment and techniques commonly used to deposit solder masses on microelectronic elements. Thus, the masses may be applied individually or, by screening the fusible conductive material onto the surface of the wafer using a mask or screen with perforations corresponding to the contacts, and then removing the mask. The mask may be formed separately from the wafer or may be formed in place on the top surface of the wafer by photolithographic techniques. The mask may be removed from the wafer by mechanically separating the mask and wafer or by dissolving the mask after deposition of the fusible metal. Suitable fluxes may be employed during deposition of the fusible metal on the wafer. The flux may be removed after deposition of the fusible metal. After the fusible metal has been deposited on the contacts of the wafer and the mask has been removed, the fusible metal may be briefly re-melted so as to reflow the fusible metal and bring it into even more intimate contact with the contacts of the wafer.

The melting temperature of the fusible conductive material desirably is within or below the normal operating temperature of the semiconductor elements in the wafer, or only slightly above the normal operating temperature range. The normal, expected range of operating temperatures of the semiconductor elements will depend upon the configuration and composition of the element, and upon the operating environment encountered in service. Typical silicon-based semiconductor elements are designed to operate at about 40° C. to about 85° C. Where the fusible conductive material melts or freezes over a range of temperatures, the term "melting temperature" as used in this disclosure should be understood as referring to the solidus temperature, i.e., the temperature at which the metal begins to melt (when heated slowly) or completes freezing (when cooled slowly).

Preferably, the melting temperature of the fusible conductive material is above normal room temperature (20° C.) so that the fusible conductive material can be handled conveniently in solid form during the steps discussed below. Thus, the fusible conductive material desirably has a melting temperature of less than about 150° C., preferably less than about 125° C. and more preferably less than about 100° C. Melting temperatures below about 85° C. are more preferred, and melting temperatures below about 65° C. are even more preferred. The range of melting temperatures between about 25° C. and 65° C. is particularly preferred, and melting temperatures between about 35° C. and about 55° C. are especially preferred. However, lower melting temperatures can be employed if the production process is altered to accommodate the lower melting temperature. For example, where a conductive material which melts at a temperature below room temperature is employed, the conductive material and the adjacent parts can be kept at sub-ambient temperatures during those process steps where the conductive material must remain solid. Conversely, where the operating temperature of the microelectronic elements is higher than the typical ranges mentioned above, higher melting fusible materials can be employed.

Among the suitable low-melting point solders are the following:

| ELEMENT | COMPOSITION 1 WEIGHT % | COMPOSITION 2 WEIGHT % |
| --- | --- | --- |
| Sn | 18.5 | 10.5 |
| Bi | 45 | 40 |
| Pb | 24 | 21.5 |
| In | 10 | 20 |
| Cd | 9.5 | 8 |
| Melting Temperature | 55° C. | 50° C. |

Solders having compositions intermediate between the two low-melting point solders illustrated in Table 1 can be used. Other suitable low-melting solders include the solder sold under the trademark Indalloy by the Indium Corporation of America, in Clinton, N.Y. For example, Indalloy Number 8 has a melting point of about 93° C., whereas Indalloy Number 117 has a melting point of about 47° C. Still other low-melting solders include other combinations of metals selected from the group consisting of cadmium, bismuth, tin, lead and indium in various proportions, with or without other metals. Additional fusible metals include mercury and mercury containing alloys.

In the next stage of the process, the dielectric sheet or second element 10 is assembled to the wafer or first element 22 so that the first surface 12 of the sheet faces toward the front surface 26 of the wafer and these confronting surfaces define a space 46 between them. The contacts 16 of the dielectric sheet or second element are aligned with the contacts 24 of the first element and aligned with masses 42 of fusible conductive material disposed on the first element contacts. The alignment between the contacts 16 of the second element and the fusible conductive masses 42 need not be perfect. The alignment need only be close enough that each contact 16 on the second element touches the correct fusible conductive mass 42 during the melting step discussed below, and so that each contact 16 on the sheet or second element does not touch any other fusible conductive mass 42.

Processes for aligning a sheet and a wafer are disclosed in commonly owned International Patent Publication WO 96/02068, the disclosure of which is hereby incorporated by reference herein as well as in copending, commonly assigned U.S. Provisional Patent Application 60/001,718, filed Jul. 31, 1995, and commonly assigned U.S. Provisional Patent Application entitled "Framed Sheet Processing," filed Oct. 17, 1997, the disclosures of which are also incorporated by reference herein. As disclosed in these applications, sheet 10 can be stretched taut by bonding it to a ring of a material such as aluminum having a coefficient of thermal expansion higher than the coefficient of thermal expansion of the sheet and then heating the assembly. While the assembly is in this taut condition at elevated temperature, the sheet is then bonded to a frame formed from a material such as molybdenum having a coefficient of thermal expansion close to that of the sheet, and the ring is removed. The assembly of the frame and the sheet can then be cooled to room temperature and the sheet will remain taut. The taut sheet can be aligned with wafer using a manually adjustable device such as a micrometer-actuated microscope stage by an operator while the operator observes the sheet and wafer under magnification. The alignment step also can be performed robotically, using generally conventional machine-vision systems. Preferably, both the dielectric sheet and the wafer are provided with fiducial marks to be used as a reference in alignment. These marks are arranged so that when the fiducial marks are aligned with one another, the contacts are also properly aligned. The sheet typically is transparent and hence the fiducial marks on the wafer can be observed through the sheet by a human operator or by a machine vision system.

While the sheet and the wafer are aligned with one another, the sheet is pressed inwardly, toward the wafer so that the exposed surfaces of the contacts on the first or inwardly facing surface 12 of sheet 10 engage the fusible conductive masses 42. This can be accomplished by placing the elements between a pair of plates 48 and 50 so that a first plate engages wafer 22 on its bottom or outwardly facing surface whereas a second plate engages sheet 14 along its top or outwardly facing surface 14, and urging plates 50 and 48 towards one another. Depending upon the configuration of terminals 17 and the bonding materials thereon, plate 50 may be provided with pockets or recesses corresponding to the terminals. The sheet may be held in engagement with plate 50 by application of vacuum through ports 52 in the plate. Alternatively, plate 50 can be provided with a resilient covering such as a foam on the surface of the plate which engages the sheet surface. In yet another alternative, a rigid stiffening plate (not shown) may be provided between plate 50 and the sheet surface. A gas or other fluid may be introduced between plate 50 and the stiffening plate so that the fluid pressure urges the stiffening plate and the sheet inwardly, towards the wafer until the stiffening plate and sheet reach a stop (not shown).

While the contacts are held in engagement with the fusible conductive masses, the conductive masses are brought to a temperature above their melting temperature, so that the conductive material at least partially liquefies and flows into intimate engagement with the exposed surfaces of the contacts 16 on the sheet. This may be accomplished by heating the assemblage after the second element or sheet 10 has been engaged with the wafer and conductive masses. Alternatively, the wafer and the conductive masses may be at a temperature above the melting temperature of the fusible conductive material prior to engagement of the sheet. The sheet and hence the contacts 16 can also be preheated to a temperature above the melting temperature of the fusible conductive masses before engagement with masses 42. In yet another alternative, only the sheet 10 and contacts 16 are at a temperature above the melting temperature of the masses, whereas the masses themselves and the wafer are at a temperature slightly below the melting temperature. In this arrangement, each mass will be only partially melted in the region adjacent the mating contact 16 on the sheet.

The molten conductive material wets the barrier metal 18 on the surfaces of contacts 16. A flux may be employed in this step as well. Any flux used in the process may be removed by flushing space 46 with a suitable solvent and removing the solvent. While the masses are in at least a partially molten condition, plate 50 holds the sheet and hence terminals in a substantially planar condition, with the exposed surfaces of the terminals on the second or outwardly facing surface 14 of the sheet in substantially coplanar alignment with one another. The plates also maintain the alignment of the contacts 16 and masses 42 in horizontal directions, parallel to the opposed surfaces 26 and 12 of the first and second elements. While the elements are aligned in this manner, the conductive masses are cooled to below their melting temperature, as by cooling the entire assemblage, including plates 50 and 48. If the fusible masses 42 were only partially melted, as where the masses were originally at below-melting temperatures and the contact 16 were at temperatures above the melting temperature, the partially melted portion of the masses can be cooled by heat transfer to the remaining portions of the mass.

Optionally, a polymer such as a polyparaxylene coating 43 may be provided over the fusible conductive masses 42. As shown in the drawings, the polyparaxylene coating 43 is a conformal coating which fully encompasses the fusible conductive masses 42 and the adjacent regions of the contacts 16 and 24. The coating extends between the confronting surfaces of the dielectric sheet 10 and the wafer 22, and may cover portions of these surfaces as well. The coating 43 helps to retain the fusible masses 42 in place when they are in a molten condition and helps preserve the electrical isolation of the fusible conductive masses 42 from one another. The coating also helps to prevent cross-contamination; the coating prevents the fusible conductive material and the material of the compliant layer from diffusing into one another. The polymeric coating may be provided by a vapor-phase coating process of known type.

After the masses have been completely frozen and after the polymer coating (if used) has been applied, a flowable, preferably liquid material is introduced into space 46 between confronting surfaces 12 and 26 so that the flowable material fills the space and intimately surrounds masses 42 and the adjacent surfaces of contacts 16 and 24. The flowable material also intimately contacts the inwardly facing surfaces 12 and 26 of the sheet and wafer. During injection of the flowable material, the contact 16 and sheet 10 are maintained in substantially planar disposition, and the contacts are maintained in alignment with masses 42. Alignment and planarity can be maintained by adhesion between the frozen masses 42 and contacts 16, without external fixturing at this stage. Preferably, however, plates 48 and 50 of the fixture used during the melting and freezing steps discussed above remain in place. Alternatively, the assemblage of the wafer can be removed from this fixture after freezing and placed into another, similar fixture prior to injection of the flowable material. In either case, the fixtures will help to maintain the coplanarity and alignment during injection of the flowable material. In alternative embodiments, the flowable material may be introduced while the fusible conductive masses are in their liquid state. In this alternative system, the flowable material desirably has relatively low viscosity and is essentially immiscible with the molten fusible conductive material. For example, many organic materials, such as silicone gel components, are immiscible with liquid metals. The surface tension of the liquid fusible material on the opposing contacts tends to maintain the molten masses in place. The flowable material may wet the opposing surfaces of the sheet and wafer, so that flow of the material into space 46 is aided by capillary action.

After space 46 has been completely filled by the flowable material, the flowable material is cured to form a compliant resilient layer 54 occupying space 46 and intimately surrounding the fusible conductive masses 42 and contacts. The compliant layer, after curing, should have some resistance to deformation. The compliant layer may be a solid or a gel. The compliant layer may incorporate voids, and indeed may take the form of a solid or gel foam. However, the compliant layer should form substantially continuous surfaces surrounding the conductive material masses 42. Preferably, the compliant material has an elastic modulus less than about 100,000 pounds per square inch, and still lower values of elastic modulus are more preferred. The compliant layer desirably has relatively low resistance to shear between opposed surfaces 12 and 26. Preferably, the compliant layer is between about 50 and 250 microns thick. The compliant layer desirably has a low spring constant per unit area when stressed in shear between opposing surfaces 12 and 26. The compliant layer desirably also has a relatively low spring constant with respect to displacement of surfaces 12 and 26 towards and away from one another. The compliant layer 54 desirably remains soft and cohesive over a range of temperatures encompassing at least the range from the melting temperature of the fusible conductor material 42 to above the normal operating temperatures of the chips 28 constituting the wafer. The compliant layer desirably retains these properties from about 20° C. or below to about 45° C. or higher. Preferably, the compliant layer retains properties in the aforesaid ranges from about 0° C. or below to about 60° C. or above. Most preferably, the compliant layer retains the desired properties from about −65° C. or below to about 150° C. or above. In an alternative embodiment, the flowable material may be introduced around the fusible conductive masses 42 when the masses are in a liquid state. The fusible masses 42 may then be frozen before the flowable material cures or after the flowable material cures.

The flowable material used to form layer 54 should be capable of flowing, prior to cure, at temperatures below the melting temperature of the fusible conductive material in masses 42. To assure complete filling of space 46 by the flowable material, the flowable material may be injected under pressure. Also, space 46 may be evacuated prior to injection of the flowable material. Techniques for evacuation of a space between a flexible sheet and wafer and for injection of flowable, curable materials into such a space are further disclosed in the aforementioned International Patent Publication 96/02068 and United States Provisional Patent Application 60/001,718. Suitable flowable materials for forming the compliant layer include polymer compositions which are initially in the form of liquids but which cure by chemical reaction of their ingredients to form a solid or gel. Among the compositions that can be used are silicones, epoxies and urethanes. Particularly suitable compositions include silicone gels of the type sold under the designation Sylgard 577 Curable Silicone Gel by the Dow-Corning Corporation of Midland, Mich. Other suitable silicon gels are available from the Shin-etsu Corporation and from the General Electric Corporation of Schenectady, N.Y. The reaction-curable material may be provided as two mutually reactive components which are mixed immediately prior to introduction of the material into space 46 and which react spontaneously with one another at ambient temperature. Other reactive polymer compositions can be activated by application of ultraviolet light. The curing step can also be initiated or accelerated by heating the reactive polymer composition. Some or all of the curing step may entail temperatures above the melting temperature of the fusible material in masses 42. In this case, it is desirable to maintain alignment of the elements, and maintain planarity of the contacts 16 on the sheet by holding the assemblage in a fixture during at least the elevated temperature portions of the curing step.

Figure 3:
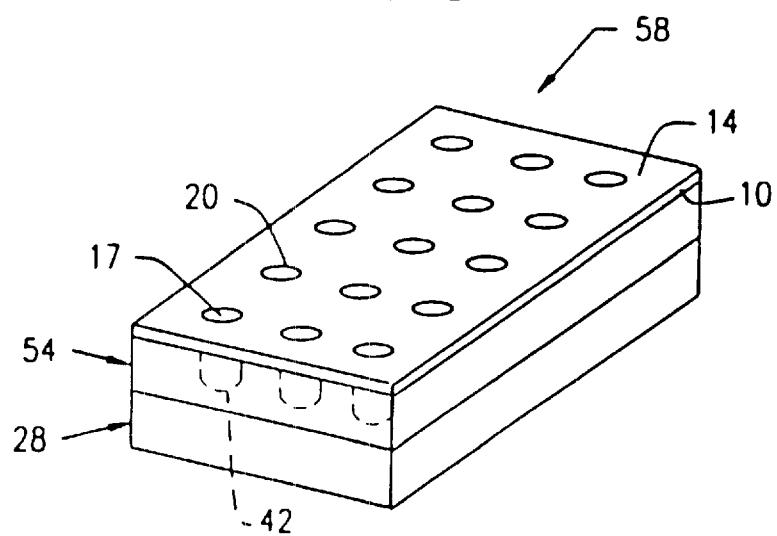
FIG. 3 is a diagrammatic perspective view depicting a subassembly made by the process of FIG. 1.
Figure 4:
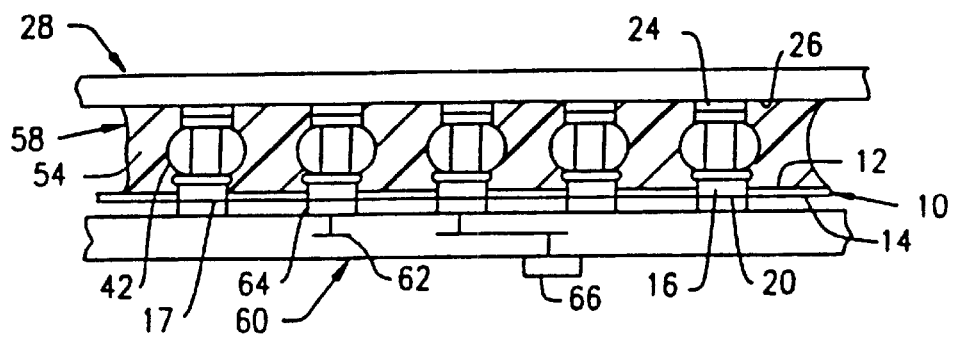
FIG. 4 is a diagrammatic, fragmentary sectional view depicting an assembly made using the subassembly of FIG. 2.

After curing to form the compliant layer, wafer 22, sheet 10 and the compliant layer 54 are severed by cutting along saw lanes 30, using a saw of the type commonly used for dicing wafers. This subdivides the assemblage into individual units 58 (FIG. 3). Each unit includes one chip 28 as well as a portion of compliant layer 54 overlying the chip and a portion of sheet 10 overlying the chip. Each unit has terminals 17 with exposed bonding material 20 on the side of sheet 10 facing away from the chip, and each unit has its contact 16 connected to the corresponding contacts of the chip by fusible conductive masses 42. These units can be handled and placed like other surface mountable electronic devices. As seen in FIG. 4, unit 58 can be placed on a substrate 60. Substrate 60 has internal electrical circuitry 62 and contact pads 64 connected to such circuitry and disposed on a surface of the substrate. The outwardly facing second surface 14 of flexible layer or second element 10 is juxtaposed with the surface of the substrate, so that the exposed surfaces of terminal 17 and bonding material 20 are engaged with contact pads 64. In this condition, the assembled parts are brought to an elevated temperature so as to activate the bonding material 20 and bond terminals 17 to contact pads 64 on the substrate. During this elevated-temperature bonding process, the fusible conductive masses 42 melt. However, the fusible conductive material of each mass is contained by the surrounding compliant layer, as well as by the first element or chip 28 and the second element or flexible sheet 10 and the contacts on these elements. In those embodiments where polymer coating 43 is used, the fusible conductive masses 42 may also be contained by the polymer coating around the masses. Therefore, the fusible conductive material remains in position and maintains electrical continuity between contact 16 and contact 24 on the chip. While unit 58 is in this condition, contacts 16 and terminals 17 can be displaced readily relative to chip 28. For example, if the contact pads on substrate 60 are out of plane, or if substrate 60 is tilted out of parallelism with chip 28, all terminals 17 can still be brought into engagement with contact pads 64 without applying destructive forces to the unit. After bonding, the assembly can be cooled, whereupon the flowable material in masses 42 will freeze.

Typically, substrate 60 incorporates additional electronic components, such as additional semiconductor chips and other components electrically interconnected with chip 28 through the conductors 62 and contact pads 64 of the substrate and through terminals 17, contacts 16 and fusible conductive masses 42. Alternatively or additionally, substrate 60 may include further connectors such as contact pads 66 or other devices such as sockets, pins for engagement in sockets, wires or other conventional interconnection devices for connecting circuitry 62 of substrate 60 with a still larger circuit. The assembly is quite compact; each unit 58 occupies an area on the surface of substrate 60 about the same size as the area of chip 42 itself.

The assembly may be incorporated in an electronic device such as a computer, a communications device, or an electronic device associated with a non-electronic machine such as an automobile or an industrial machine. During use of the device, electrical signals pass through the substrate and chip via the contacts and fusible conductive masses. Electrical power is converted to heat in the device, principally in semiconductor chip 28 and in other electronic elements of the device. The heat raises the temperature of the chip and the surrounding elements. As the temperature of the device rises, the fusible conductive masses 42 melt and are contained by the surrounding elements of the structure, including compliant layer 54, chip or first element 28 and the flexible layer or second element 10 and the contacts 16 and 24 on those elements.

As the assembly is heated, each contact 24 on the chip typically moves with respect to the corresponding contact 16 of the flexible sheet 10 or second element. Thus, as the temperature of the chip rises, the chip 28 tends to expand, thereby moving contacts 24 relative to the contact pads 64 of the substrate. For example, where the chip and substrate are formed from materials having different coefficients of thermal expansion, the contacts on the chip will move relative to the contact pads of the substrate as the entire assembly is heated. Even where the coefficients of thermal expansion are the same, differential movement will occur if the temperature of the chip rises or falls at a different rate than the temperature of the substrate. Also, the chip, the substrate or both can warp as they undergo thermal expansion and contraction. Because terminals 17 on the flexible sheet or second element 10 are bonded to the contact pads 64 of the substrate, contacts 16 will also move relative to the contacts 24 of the chip. However, while the fusible conductive material in each mass 42 is at least partially liquid, the conductive masses have essentially no resistance to deformation. The only mechanical interconnection between the first element or chip 28 and the second element or flexible layer 10, and hence the only mechanical interconnection between the chip and substrate 60, is provided by the compliant layer 54. This compliant layer can accommodate substantial movement of the chip surface relative to the surface of the second element or layer 10 without applying high forces between these elements. Accordingly, relative movement of the chip contacts 24 and substrate contact pads 64 do not apply appreciable forces at the bonds between the terminals 17 of the second element and the contact pads 64 of the substrate so that the bonds are not subject to thermally-induced fatigue as the system operates. Because the fusible conductive masses 42 are liquid, they are not subject to fatigue during operation at normal operating temperatures.

When power to the system is turned off, the device cools and the fusible conductive masses 42 may freeze again. The cycle of melting and freezing may be repeated numerous times during the service life of the device. Defects which may occur in masses 42 are automatically repaired when the masses melt and freeze. Alternatively, where the device is stored in a relatively warm environment, the conductive material and the masses 42 may remain liquid indefinitely. The metal in barrier layer 18 of contact 16 is selected to prevent dissolution of the base metal of the contact into the molten conductive material. Similarly, the contacts 24 of the chip are formed from metals which will not dissolve in the fusible conductive material. This assures that the composition of the conductive material will remain essentially unchanged and hence its melting temperature will not vary during continued use of the device. Compliant layer 54 protects the fusible conductive material from contamination and helps to assure reliability of the device. Additional packaging may be provided around the chip and substrate. For example, the chip and substrate may be encapsulated in a flexible encapsulant. The encapsulant may also penetrate between layer 10 and substrate 60. Other conventional packaging elements, such as metallic shields or "cans", heat spreaders and the like may be included in the assembly. As discussed in more detail below, further fusible conductive masses may be provided between the chip or other first microelectronic element and the packaging element to conduct heat for dissipating heat from the assembly.

In a variant of the assembly process discussed above, the finished unit 58 may be tested by engaging it with a test substrate so as to engage the exposed surface of each terminal 17 with a contact on the test substrate and then operating chip 28 by applying signals through the terminals. Prior to or during such engagement, unit 58 is heated to a temperature high enough to melt the fusible conductive masses 42, but not high enough to activate the bonding material 20 on the contacts. This allows the compliant layer 54 and masses 42 to deform and hence allows the terminals 17 on the exposed surface of the unit to engage the contacts of the test substrate even where the test substrate and/or terminals 17 are not precisely coplanar.

Figure 5:
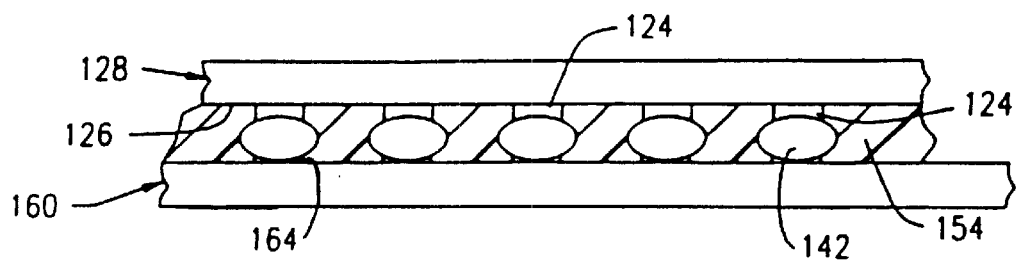
FIG. 5 is a diagrammatic, sectional view similar to FIG. 4, but depicting a portion of an assembly in accordance with a further embodiment of the invention.

An assembly according to a further embodiment of the invention (FIG. 5) includes a substantially rigid first element such as a chip 128 with contacts 124 on a front surface 126, and also includes a substantially rigid second element such as a substrate 160 with contacts 164 on an interior surface. The contact-bearing surface 126 of the chip overlies the contact-bearing surface of the substrate. Here again, masses of a fusible conductive material 142 are disposed between contacts 124 and contacts 164. Masses 142 are surrounded by a compliant layer 154 substantially filling the space between the confronting surfaces of the first and second elements and intimately surrounding masses 142. In this embodiment as well, the contacts are provided with barrier layers to avoid dissolution of the contact metals in the fusible conductive material. Structures according to this embodiment may be fabricated by assembling the first and second elements with the fusible conductive material masses, momentarily melting the masses by heating the assembly and then freezing the masses. These steps may be performed using techniques similar to those used in the so-called controlled collapse chip connection technique, commonly referred to as "C4" bonding. C4 bonding is described in detail in Multi-Chip Module Technologies and Alternatives-the Basics, Doane and Franzon, eds; 1993, pp. 450–476 and 434–446, the disclosure of which is hereby incorporated by reference herein. However, the steps of C4 bonding involving melting of the solder typically would be performed at a far lower temperature in preferred embodiments according to this aspect of the invention than in conventional C4 bonding processes employing ordinary solder. After joining the chip and substrate by C4 bonding, compliant layer 154 is formed by injecting a flowable material as an encapsulant into the space between the confronting surfaces of the chip and substrate and curing the flowable to form a solid, gel or form as discussed above. Assemblies according to this aspect of the present invention provide benefits similar to those discussed above. Once again, at operating temperature, the chip is mechanically connected to the substrate only through the compliant layer 154. Masses 142 are molten and hence provide essentially no resistance to relative movement between the chip and substrate contacts or between the chip 128 and the substrate 160 as a whole. By contrast, in conventional assemblies fabricated by C4 processing, the solder joints remain solid at operating temperature and are subjected to fatigue stresses during thermal cycling.

Figure 6:
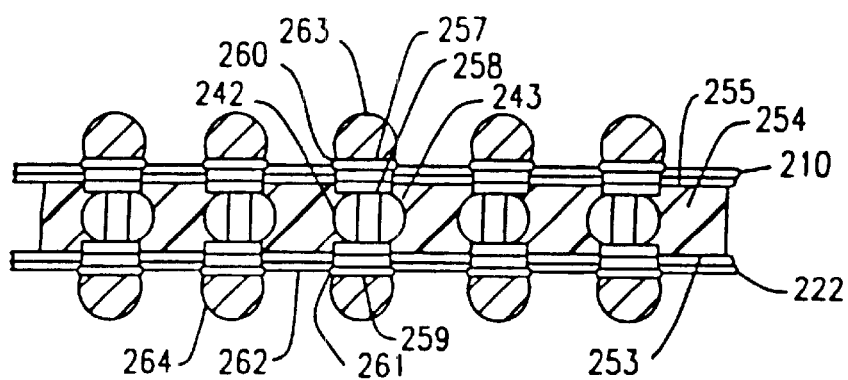
FIG. 6 is a fragmentary sectional view depicting a component in accordance with yet another embodiment of the invention.

As illustrated in FIG. 6, a further embodiment of the invention provides a connection component 200 including a compliant layer 254 with a first surface 253 and a second surface 255. Holes or cavities 243 extend through the compliant layer. A mass 242 of a fusible conductive material is disposed within each hole or cavity 243. A connection component according to this aspect of the invention, can be fabricated by procedures similar to those discussed above. However, in this instance the first element 210 and second element 222 are both held in a taut condition and aligned with one another with fusible conductive masses 242 disposed therebetween. Once again, after the conductive material has been reflowed into contact with contacts 258 and 262, it is frozen and the flowable material is injected and cured to form compliant layer 254. Connection components according to this aspect of the invention can be used for interconnecting other microelectronic elements such as a chip and a substrate. Thus, the connection component can be placed between confronting surfaces of an element such as a chip 280 and another element such as a substrate 282 (FIG. 7) so that first terminals 260 face the contacts of chip 280 whereas second terminals 261 face the contacts of substrate 282. The assemblage is heated to a temperature sufficient to activate the solder or bonding materials 263, 264 on the terminals, thereby fusing the terminals to the contacts of the chip and substrate. During this step, the fusible conductive material 242 melts, but is retained in position by compliant layer 254. The compliant layer can bend and compress locally as required during this bonding process, to assure good engagement between terminals 260 and 261 and the contacts of the chip and substrate. After completion of the bonding process, first terminals 260 and hence contacts 258 are fixed to the chip, whereas second terminals 261 and the associated contacts 262 are fixed to the substrate. A further encapsulant (not shown) may be introduced between sheet 222 and chip 280, and between sheet 222 and the substrate, to fill voids in these regions. In use, the fusible conductive masses 242 melt and allow contacts 258, fixed to the chip, to move relative to contacts 262 on the substrate.

Figure 8:
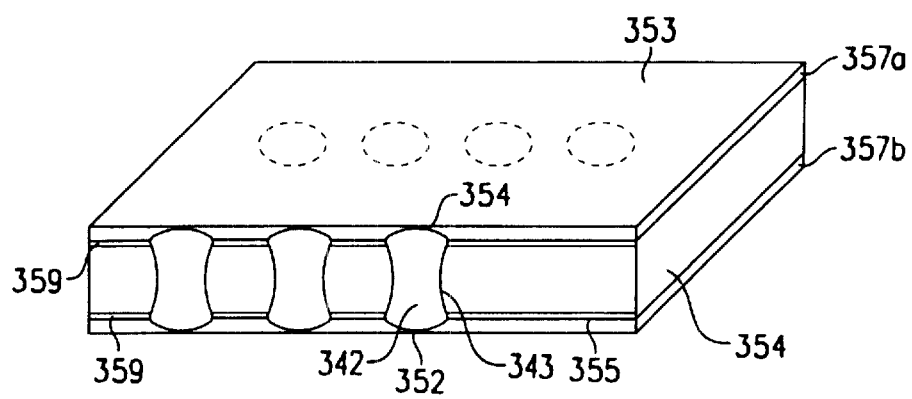
FIG. 8 is a diagrammatic perspective view depicting a component in accordance with a further embodiment of the invention.

As shown in FIG. 8, a simpler connection component includes a layer of a matrix material 354 having oppositely directed top and bottom surfaces 353, 355 extending in lateral directions. The matrix material may include compliant materials having a degradation temperature higher than the melting temperature of the fusible conductive masses or curable precursor materials. The compliant material may be of the same types as discussed above. A curable precursor matrix material may be formed from the flowable materials discussed above, but preferably has somewhat greater cohesion. For example, a curable precursor matrix material can be formed by partially curing a flowable liquid material to provide a material which is still deformable but which has some cohesion and which will remain in place. Alternatively or additionally, fillers such as silica may be added to a flowable material to make it highly thixotropic. The matrix layer defines holes or cavities 343 extending between these surfaces. Masses 342 of a flowable conductive material are disposed within cavities 343. The individual fusible conductive masses are dispersed in the layer of matrix material so that the masses are spaced from one another in the lateral directions and separated from one another by the matrix material. The fusible conductive masses preferably are formed from fusible materials of the types discussed above.

Each mass 342 has an exposed portion 352 at the first surface of matrix layer 354 and a similar exposed portion 354 at the second surface. A first removable release liner 357A overlies the top surface 353 of the layer 354 and a second release liner 357B overlies the bottom surface 355 of the layer 354. A thin layer of an adhesive 359 optionally may be provided over the top surface 353 or the bottom surface 355, as by coating these surfaces before the release liners 357A and 357B are provided and preferably before masses 342 are provided. The release liners isolate the layer 354 and the masses 342 from contaminants during storage.

Components according to this embodiment of the invention can be fabricated by a variety of processes. Thus, the compliant layer 354 can be injection molded to form cavities 343 and then filled with the flowable conductive material. To facilitate such filling, the interior surfaces of holes 343 may be treated to improve wettability of the compliant material by the conductive material, as by electroless plating of the interior surfaces of the holes. Alternatively, the masses 342 can be placed into a mold and a liquid material may be introduced into the mold and solidified around the masses in the manner discussed above.

Figure 2:
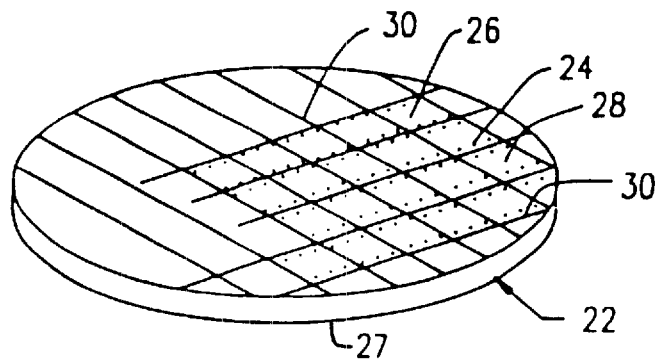
FIG. 2 is a diagrammatic perspective view depicting a wafer utilized in the process of FIG. 1.

Components according to FIG. 8 may be provided, handled and stored separately from the microelectronic elements. These components can be used to interconnect opposed microelectronic elements similar to those shown and described above. In such an assembly process, the component is assembled with one microelectronic element, so that the top or bottom surface of the matrix layer is engaged with the microelectronic element. Where the conductive masses are to provide circuit interconnection, this assembly procedure should be performed so that the conductive masses are engaged with contacts on the microelectronic element. The opposite microelectronic element is engaged with the other surface of the matrix layer in similar fashion. Preferably, the matrix layer is bonded to the surfaces of the microelectronic elements. The adhesive layer provided over the top and bottom surfaces 353 and 355 bonds and assures a void-free interface between layer 354 and the microelectronic elements. Alternatively or additionally, compliant layer 354 itself may be arranged to adhere to the surfaces of the mating elements. For example, matrix layer 354 may be formed as a partially cured or "B-stage" material. When the component is engaged between mating elements and heated to melt masses 342, the partially cured material fully cures and bonds with the surfaces of the mating elements. Once the component is assembled with the opposed microelectronic elements, the contacts on the opposed elements bear on the fusible conductive masses 342 and help to contain the masses within holes 343. The resulting assembly may have a configuration similar to the assembly of FIG. 5, in that the fusible conductive material bears directly on the contacts of the elements such as a chip and a substrate, and the surfaces of compliant layer 354 bear directly on these elements. Separately-formed components as shown in FIG. 8 are particularly useful in providing thermally conductive connections between elements. In this use, the components can be applied to surfaces of microelectronic elements without regard for locations of electrical contacts. In one process, a large component as shown in FIG. 8 is applied to the rear surface 27 of a wafer (FIG. 2) before the wafer is severed to separate the individual chips from the wafer. Thus, each severed chip includes a matrix layer conductive masses on its rear surface, which can be used to mount the rear surface on a circuit board or to connect a package element such as a heat spreader or heat sink to the chip. Such a process can be performed in conjunction with processes as discussed above for providing similar masses on the front or contact-bearing surface.

Figure 7:
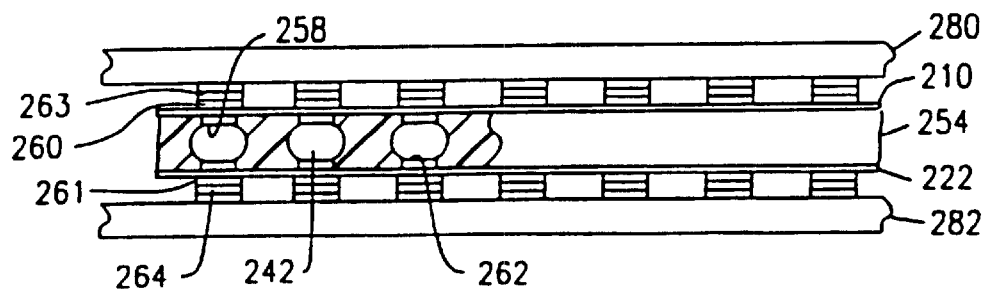
FIG. 7 is a diagrammatic elevational view of an assembly incorporating the subassembly of FIG. 6.

Further embodiments, not shown in the drawings, can incorporate combinations of the features discussed above. For example, a component as depicted in FIG. 8 may include terminal assemblies as depicted in FIGS. 6 and 7 on one or both sides of the compliant layer without the flexible sheets 210, 222, or with such a flexible sheet on only one side.

Figure 9:
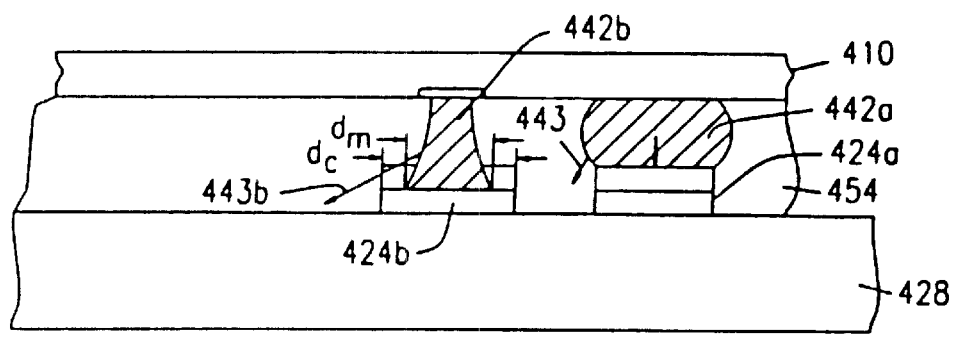
FIG. 9 is a fragmentary view on an enlarged scale depicting portions of an assembly in accordance with a further embodiment of the invention.

One consideration in design is the effect of alpha radiation emitted by the conductive materials. Alpha radiation is known to damage the electronic components incorporated in semiconductor chips and to cause momentary errors in operation of such components. Fusible conductive materials which contain heavy metals typically contain small amounts of radioactive isotopes which emit alpha particles. Several measures may be taken to control the effects of alpha radiation on the underlying chip. One such approach is to limit the amount of alpha particle radiation emitted by controlling the radioactive isotope content of the fusible conductive material. Alternatively or additionally, the physical configuration of the contacts and fusible conductive masses may be selected to limit the effects of alpha radiation. Ordinarily, the contacts themselves provide effective shielding against alpha radiation. Alpha particles normally cannot pass directly through a metallic contact into the underlying electronic components of the chip. For example, as shown in FIG. 9, the alpha radiation emitted by fusible conductive mass 442a normally cannot pass directly through contact 424a. Any deleterious effects of alpha radiation on the chip are caused by alpha particles passing around the edges of the contact along paths such as path 443. Simply increasing the thickness of contact 424a limits the effect of such alpha radiation. Because the fusible material mass 442a is spaced at a substantial distance above the surface of chip 428, alpha particles passing along path 443 and along other paths around the periphery of contact 424a must pass through a substantial thickness of compliant layer 454 so that the compliant material absorbs most of the alpha radiation. Alternatively or additionally, the contact may have a larger diameter than the fusible conductive mass. For example, contact 424b has a diameter $D_c$ substantially larger than the diameter $D_m$ of mass 442b at the juncture of the mass and contact. This assures that any alpha radiation passing around the periphery of the contact will pass along a path 443b at a relatively low angle to the chip surface. Here again, the length of a straight path from the fusible conductive mass to the chip surface is markedly increased. To assure that the fusible conductive mass remains at or near the center of contact 424b, the contact is provided with a ring of a material which is not wettable by the fusible conductive material. The polyparaxylene coating described above may maintain the fusible conductive mass in place when the mass is in its liquid state. In still further embodiments, the contact or the barrier metal at the surface of the contact adjacent the fusible conductive mass may be non-wettable by the fusible material. A small spot adjacent to center of the contact may be plated with a metal which is wettable by the fusible material. Also, the mass 442b is tapered inwardly towards its central axis in the vertical direction upwardly, away from the contact 424b. This further assures a long path length from the mass surface to the chip surface. Such tapered masses can be produced by processes such as that discussed above with reference to FIG. 8. Also, the masses can be tapered by techniques commonly used in the C4 bonding art, as by momentarily moving chip 428 away from the mating element 410 while the fusible conductive material is in a molten state.

Figure 10:
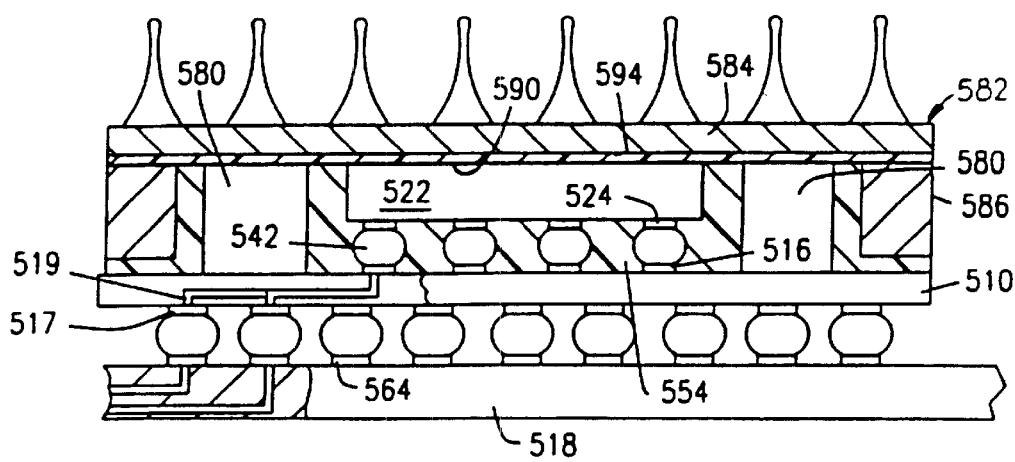
FIG. 10 is a diagrammatic sectional view of an assembly in accordance with a further embodiment of the invention.

As shown in FIG. 10, an assembly in accordance with a further embodiment of the invention includes a chip or first element 522 and a second element 510 including a flexible multilayer sheet. Sheet 510 has contacts 516 on a first side facing inwardly, toward the chip or first element, and has terminals 517 on the opposite, outwardly-facing side. As in the embodiments discussed above, contacts 516 are disposed in a pattern corresponding to the pattern of contacts 524 on the chip. Terminals 517 are not integral with contacts 516. Instead, the terminals are distributed on the outwardly-facing side of sheet 510 in an array different from the pattern of contacts 516. In the depicted embodiment, terminals 517 occupy a larger area of the sheet than contacts 516. Terminals 517 are connected to contacts 516 by leads 519 extending within sheet 510. Sheet 510 may be a multilayer structure, with the leads disposed between layers. The assembly further includes additional electrical elements 580 mounted to sheet 510 and electrically connected to leads 519, so that the additional elements are connected between some of contacts 516 and terminals 517. The additional elements may include any circuit element, but most typically include capacitors. The capacitors typically are connected to the terminals and contacts which form the power and ground connections to the chip. As in the arrangements discussed above, the electrical contacts 524 of the first element or chip 522 are connected to the contacts 516 by fusible, electrically-conductive masses 542.

The assembly further includes a package element adapted to physically support and protect the chip and additional electrical elements. The package element is depicted schematically as a heat sink 584 defining a back wall and a separate ring 586 surrounding the chip and additional circuit elements. Heat sink 582 thus forms a back wall of the package, whereas ring 586 forms side walls. Flexible sheet 510 extends across the front of the package, and overlies ring 586. Ring 586 and heat sink 582 can also be formed integrally with one another to provide a unitary shell. The back wall or heat sink 584 has a region 592 confronting the rear surface 590 of the chip. A thermally conductive adhesive 594 forms a bond between the rear surface 590 of the chip and region 592 of heat sink 584, and provides enhanced thermal conductance between the rear surface 590 and the heat sink or back wall. Other devices for providing enhanced thermal conductance may be used. For example, arrangements of flexible thermal conductors as taught in copending, commonly-assigned U.S. patent application Ser. No. 08/342, 222, filed Nov. 18, 1994, the disclosure of which is also incorporated by reference herein, may be employed between the chip and the heat sink. Alternatively, as further discussed below with reference to FIGS. 24–26, fusible conductive masses having properties identical to or substantially similar to those described above may be provided between the rear surface 590 and the heat sink to conduct heat therebetween during operation of the assembly.

As in the embodiments discussed above, the fusible conductive masses 542 disposed between the contacts are intimately surrounded by a layer of a compliant material 554. The compliant layer 554 may be formed integrally with encapsulant filling the space cooperatively enclosed by the package elements 584 and 586 and sheet 510. In fabrication of the assembly, chip 522, sheet 510 and fusible masses 542 may be assembled as discussed above, and additional circuit elements 580 may be assembled to the sheet. A first portion of the encapsulant may be introduced into the space between the chip and sheet and cured to form compliant layer 554 while leaving rear surface 590 exposed. After this step, thermal adhesive 594 and heat sink 582 may be added. The reverse process may also be employed, in which the chip is assembled to the heat sink with thermal adhesive 594, followed by assembly of sheet 510 and masses 542 and formation of layer 554.

The assembly can be handled and mounted using ordinary surface-mounting techniques. Here again, terminals 517 on sheet 510 are bonded to contact pads 564 of a substrate 568 to form the electrical connections between the chip 522 and other components. During the surface mounting procedure, the assembly may be exposed to temperatures in excess of the melting temperature of the conductive masses 642 so that the masses melt. As described above, the resulting liquid masses are contained by the compliant layer 554. After the surface mounting procedure, the masses are allowed to freeze. The assembly may also be exposed to high temperatures during other manufacturing procedures, such as during soldering of substrate 568 to other components; during high-temperature encapsulation processes such as molding or high-temperature curing of an encapsulant around the assembly; or during testing, storage or shipment. During each such high-temperature exposure, fusible conductive masses 542 melt and allow movement of terminals 517 relative to the chip. During operation of the completed assembly, masses 542 will melt, but will remain in place to provide a stress-free electrical interconnection as discussed above.

Figure 11:
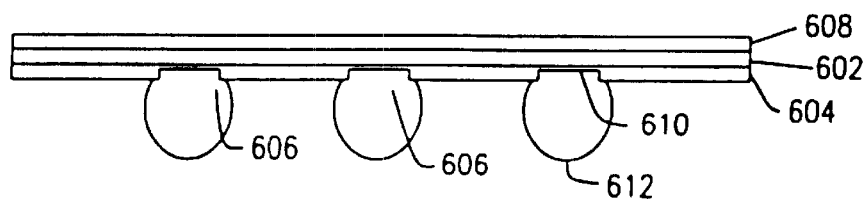
FIGS. 11 through 14 are fragmentary diagrammatic sectional views of an assembly during successive stages in a fabrication process in accordance with another embodiment of the invention.
Figure 12:
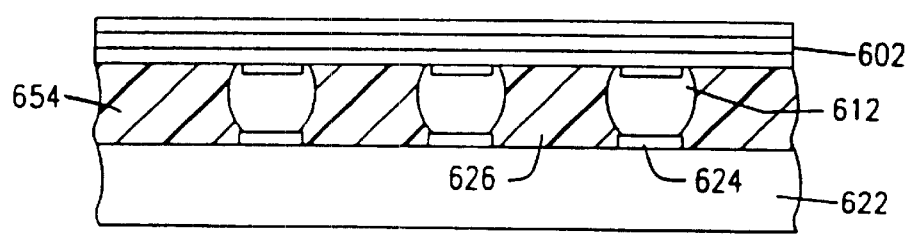

Referring to FIG. 11, a process according to a further embodiment of the present invention utilizes a plate 602 of a metal, preferably copper or a copper alloy. The metallic plate is large enough to cover an entire wafer; however, only a small portion of the metallic plate is seen in FIG. 11. A first surface of the plate is covered by a first resist layer 604 with apertures 606 disposed in locations corresponding to the locations of contacts on a wafer. The locations and sizes of apertures 606 can be controlled precisely using conventional photographic techniques for forming resist patterns. The second surface of the plate is covered by a uniform layer of a resist 608. Spots 610 of a barrier metal are then applied on the first surface of the plate in apertures 606. After the barrier metal is applied, the plate is then exposed to the fusible material in molten form, as by dipping the plate into the molten material; by passing the plate through a flowing curtain or shower of the molten material; or by exposing the first surface of the plate to a wave of molten material using conventional wave-soldering equipment. The dipping procedure is preferred. Because the molten material does not wet the resist layers 604 and 608, but does wet barrier metal 610, a drop 612 of molten material will cling to the plate at each aperture 606 after the plate is withdrawn from the molten material. The drops freeze to form fusible material masses. Numerous masses can be formed simultaneously at extremely low cost; there is no need for controlled application of the molten material.

In the next stage of the process, resist layer 604 and 608 are stripped using conventional removal techniques. Metallic plate 602, with masses 612 on it, is heated to a temperature sufficient to remelt fusible material 612 and the plate 602 and masses are assembled to a wafer 622. The plate is aligned with the wafer so that each mass 612 is aligned with a contact 624 on the surface of the wafer. The fusible conductive masses 612 bonds with the contacts 624 of the wafer. After the bonds have formed, the assembly is cooled to below the melting temperature of the fusible conductive masses, thereby refreezing masses 612.

Because plate 602 is metallic, its thermal expansion properties are quite uniform and isotropic so that the distances between the masses vary in a predictable manner with the temperature of the plate. Moreover, the metal plate resists stretching and compression in directions parallel to its surfaces. These factors greatly facilitate precise alignment of masses 612 with contacts 624. During assembly with the wafer 622, plate 602 can be supported and engaged with the wafer by a press plate, similar to the press plates 50 discussed above with reference to FIG. 1, which supports plate 602 over substantially its entire surface and reinforces plate 602 against bending. However, where plate 602 is thick enough to resist bending, it can be handled and assembled to the wafer using other equipment which does not support the plate over its surface.

Figure 13:
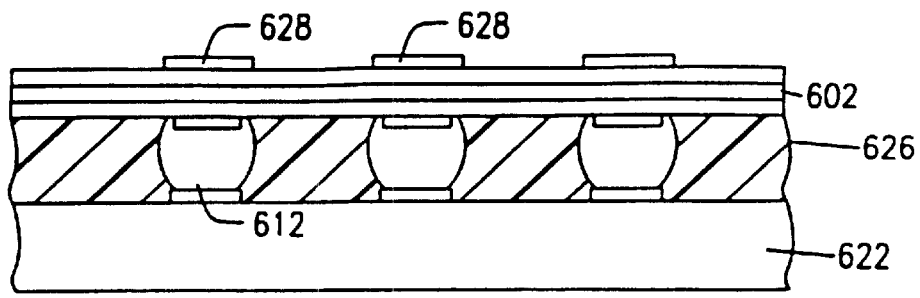
Figure 14:
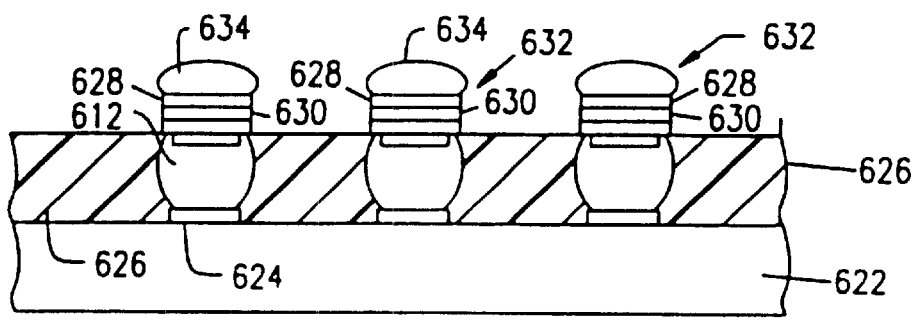

Referring to FIG. 13, after masses 612 have frozen, a curable material is injected between plate 602 and wafer 622 and cured to form a compliant material layer 626 intimately surrounding masses 612. After curing of the compliant material, an etch-resistant metal, such as gold, is applied in spots 628 aligned with masses 612. The etch-resistant metal can be applied using conventional plating techniques with a conventional photoresist (not shown). After the photoresist is stripped, plate 602 is exposed to an etchant, such as an acid, which removes the plate except in the regions 630 protected by spots 628. During the plating, resist-stripping and etching steps, wafer 622 is protected from chemical contamination by the overlying compliant layer 626.

The etching process thus subdivides the plate into separate regions 630, leaving each region attached to a mass of fusible conductive material 612. Each region 630, with the overlying metal spot 628, forms a separate terminal assembly 632, mechanically decoupled from the other terminal assemblies. A further bonding material 634 may be applied on the terminal assemblies, and the wafer may be severed to form individual units, each including one chip and the associated terminal assemblies and fusible masses, together with a portion of the compliant layer. The finished unit thus has a microelectronic element 622; a layer 626 of a compliant material overlying the microelectronic element, and terminal assemblies 632 disposed on the side of layer 626 opposite from the microelectronic element. Each terminal assembly is connected to a contact 624 on the microelectronic element by a fusible mass 612. The units may be handled, tested and bonded to substrates in the same manner as the units 58 discussed above with reference to FIG. 3.

Figure 15:
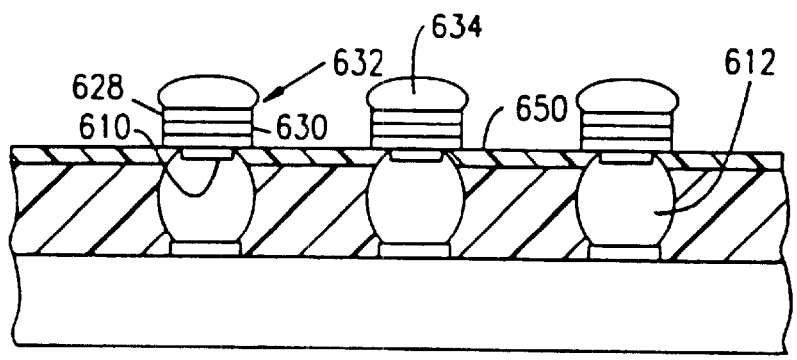
FIG. 15 is a view similar to FIGS. 11–14 but depicting an assembly in accordance with yet another embodiment of the invention.

In a variant of this process, the patterned resist 604 (FIG. 11) is replaced by a flexible dielectric sheet 650 (FIG. 15) defining the same pattern of apertures. Sheet 650 may be formed from a polymeric material such as a polyimide. The sheet may be formed in situ on the surface of the metal plate, as by coating the surface with a liquid precursor and curing the coating to form the sheet. The polymeric sheet may be provided with the apertures by selectively etching or ablating the sheet using processes which do not substantially affect the underlying metal plate. The remaining steps of the process are conducted in substantially the same way as discussed above with reference to FIGS. 11–14, except that sheet 650 is not removed. Thus, sheet 650 remains during and after the etching process to provide additional protection to the wafer. During the severing step, sheet 650 is severed along with the compliant layer 626.

Figure 16:
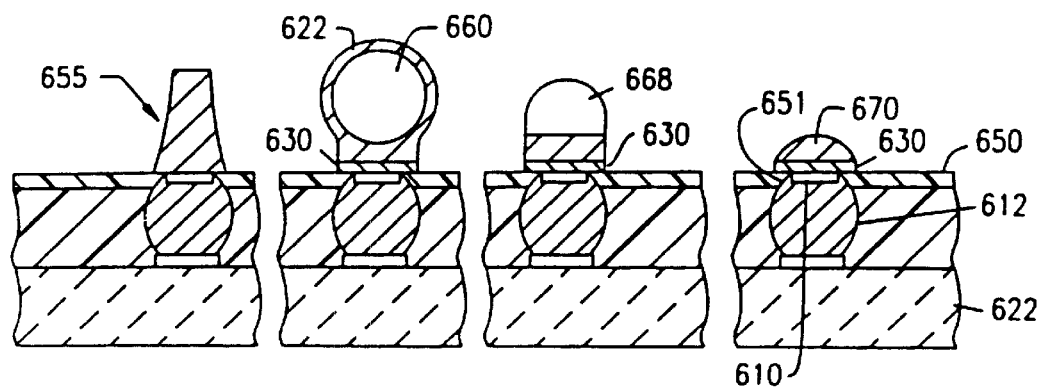
FIGS. 16 is a fragmentary diagrammatic sectional view depicting elements according to further embodiments of the invention.

Referring to FIG. 16, a great variety of terminal shapes and types may be provided using the processes discussed above. The etching step used to subdivide the metallic plate may form numerous posts 655, each constituting a single terminal assembly associated with one fusible metal mass 612. The techniques used for forming posts disclosed in copending, commonly-assigned U.S. patent application Ser. No. 08/366,236, filed Dec. 29, 1994, the disclosure of which is hereby incorporated by reference herein. As set forth in said '236 application, a continuous metallic plate can be formed into a plurality of posts by applying a photoresist to the exposed surface of the plate and selectively treating the photoresist to leave a pattern of spots covered by etch-resistant regions, and then exposing the surface to an etchant. As also described in the '236 application, a microelectronic assembly having an array of such posts can be engaged with a mating unit having sockets adapted to engage the posts.

A different form of terminal assembly, also illustrated in FIG. 16, has a solid-core solder ball including a core 660 formed from a high-melting, highly conductive metal such as copper, surrounded by a layer 662 of a solder overlying a region 630 formed by severing the sheet. Another form of terminal assembly has a mass of conventional solder 668 overlying each region 630. Yet another terminal assembly has a metal bump 670 formed from gold, copper or other solderable metal on each region. As will be appreciated, the various types of terminal assemblies illustrated in FIG. 16 normally are not found in a single unit; they are illustrated together for ease of comparison. The terminal assemblies on dielectric sheet or element are disposed on the side of the sheet facing away from the opposite element or chip 622. However, each terminal assembly defines a contact surface, covered by barrier metal spot 610, facing toward the opposite element or chip 622 and exposed through an aperture 651 in sheet 650. Thus, each fusible conductive mass extends through an aperture in the sheet to the contact surface of the associated terminal assembly.

Figure 17:
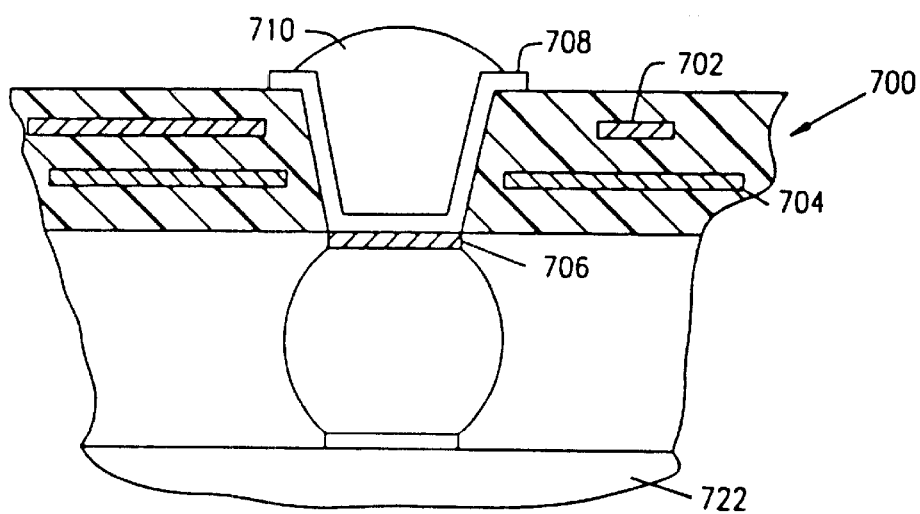
FIG. 17 is a fragmentary diagrammatic-sectional view depicting elements according to yet another embodiment of the invention.

In the embodiment of FIG. 17, one element is a multilayer dielectric sheet 700 with conductors 702 and potential planes 704 disposed in and on the sheet. Each terminal assembly includes a metallic via liner 706 extending through the sheet and defining a contact surface on the side of the sheet facing toward the opposite element 722. Each via liner defines a terminal 708 on the surface facing away from the opposite element 722, and a bonding material 710 may be provided on such terminal surface. The contacts and terminals discussed above with reference to FIGS. 1–4 may have the configuration illustrated in FIG. 17.

Figure 18:
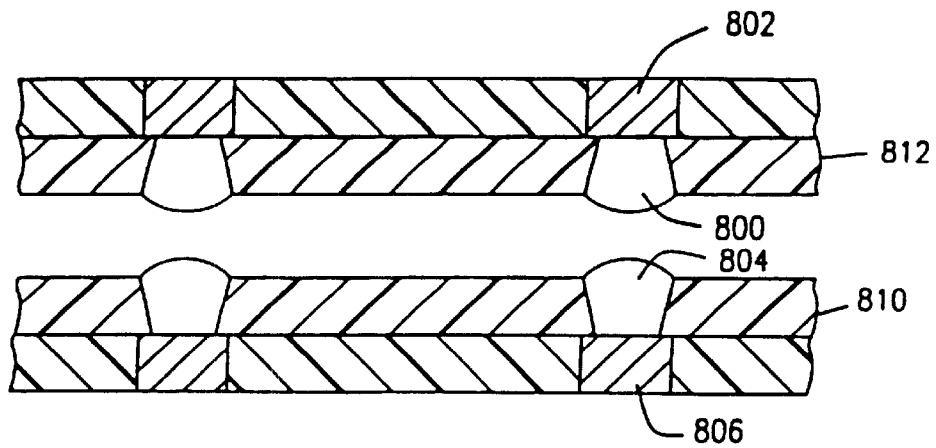
FIG. 18 is a further fragmentary diagrammatic sectional view depicting elements during a process according to another embodiment of the invention.

As illustrated in FIG. 18, it may be desirable to form fusible conductive masses by applying a first mass 800 in contact with the terminal assembly or contact 802 of one element; applying a second mass 804 in contact with the terminal assembly or contact 806 of the opposite element, and then merging these masses with one another by bringing the elements towards one another while the masses are both liquid or molten. Masses 800 and 804 can be applied to the individual elements while the surfaces of the elements remain open and accessible. Thus, fluxes may be applied to facilitate wetting of the contacts by masses 800 and 804, and can be removed readily by rinsing. Once masses 800 and 804 have wet their respective contacts, they can be readily united with one another; the fusible material will merge with itself without difficulty. As illustrated in FIG. 18, the fusible materials on each element may be surrounded by partially cured compliant material layers 810, 812 on each element, and these layers may be united with one another when the elements are brought together, so as to form the compliant material layer surrounding the united fusible conductive masses. Alternatively, the compliant layer may be formed in place between the elements, in the manner described above, after uniting the fusible conductive masses.

Figure 19:
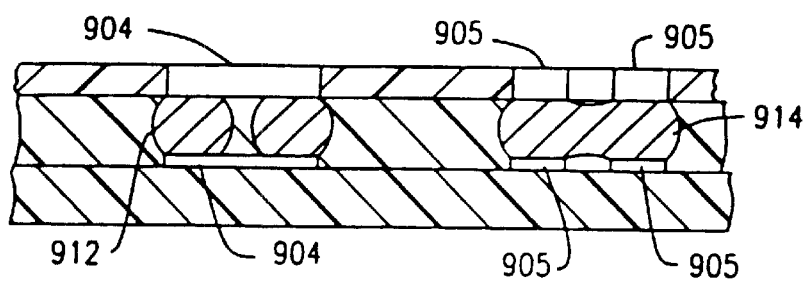
FIG. 19 is a fragmentary diagrammatic sectional view depicting elements according to still another embodiment of the invention.

As shown in FIG. 19, there need not be one-to-one association between the fusible masses and the terminal assemblies or contacts. Thus, a large terminal assembly or contact 904 on one element may be connected to several fusible masses 912. Conversely, a large mass 914 may be connected to several terminal assemblies 905. Thus, each mass may be associated with one or more contacts or terminal assemblies on each element, and each terminal assembly or contact may be associated with one or more fusible masses.

Figure 20:
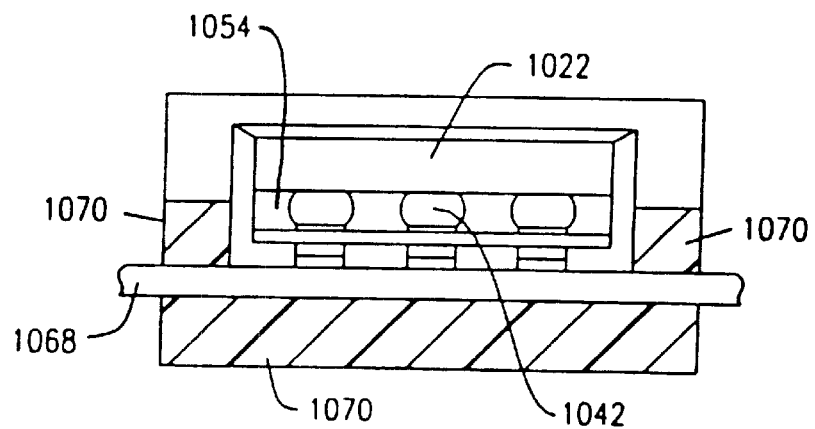
FIG. 20 is a diagrammatic sectional view depicting an assembly in accordance with yet another embodiment of the invention.

As shown in FIG. 20, an assembly according to a further embodiment of the invention includes a chip 1022 connected to the substrate 1068 through fusible material masses 1042 which are again surrounded by a compliant material 1054. Thermal insulation 1070 may be provided around the assembly, particularly in the areas adjacent the fusible masses, so as to assure that the fusible masses reach their melting temperature when the chip is in operation.

As will be readily appreciated in light of the foregoing discussion, numerous variations and combinations of the features discussed above can be utilized without departing from the present invention. For example, fusible conductive materials other than metals can be employed. These include aqueous and non-aqueous electrolytes. Low-melting conductive compositions including polymeric materials can also be employed. Moreover, the fusible conductive material need not be uniform in composition and need not be entirely molten even at the operating temperature of the device. For example, the fusible conductive material may include particles of a first conductive material such as copper, silver or graphite having a high melting temperature dispersed in a second conductive material, such as a low-melting solder or an electrolyte, having a lower melting temperature. At the operating temperature of the device, the second conductive material is liquid but the first conductive material remains solid, so that the fusible material as a whole is in the form of a conductive slurry. As used in this disclosure, the term "liquid" should be understood as including a slurry unless otherwise specified. The first and second conductive materials should be insoluble in one another and non-reactive with one another. The particles of the first conductive material can be plated or otherwise coated with a barrier material as discussed above to inhibit solution and reaction between the particles and the second conductive material.

In the embodiments discussed above, the fusible conductive masses melt during normal operation of the assembly. In a further variant of the invention, the melting temperature of the fusible material is above the normal operating temperature of the microelectronic elements, but below the temperatures encountered by the assembly during manufacturing, storage or shipment. In this variant, the fusible conductive material acts to limit stress applied to the electrical connections due to high temperature exposure in processing steps such as manufacturing, storage or shipment. Indeed, the assembly may be deliberately heated so as to melt the fusible material and thus repair any defects in the masses. Where the assembly is part of a larger device such as a multichip module or circuit board, the melting temperature of the fusible material desirably is below the maximum temperature which can be tolerated by the remainder of the device, so that the assembly can be repaired by heating without removing it from the remainder of the device.

Figure 21:
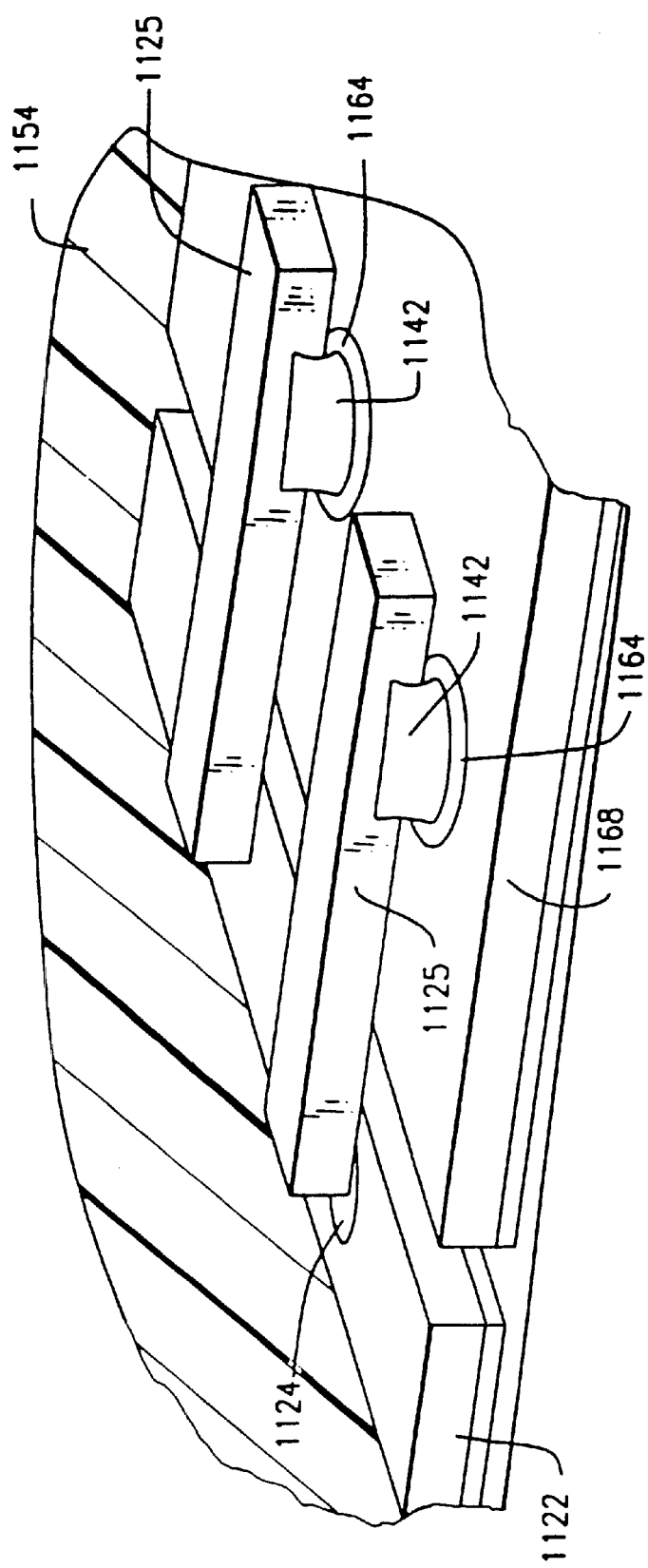
FIG. 21 is a diagrammatic, partially cutaway, perspective view depicting an assembly in accordance with yet another embodiment of the invention.

According to further variants of the invention, the elements which are electrically connected to one another need not have confronting surfaces, and the masses of liquid or fusible material need not be physically disposed between the elements. For example, as shown in FIG. 21, a microelectronic element such as a semiconductor chip 1122 may be provided with beam leads 1125 connected to the contacts 1124 of the chip. The beam leads project outwardly away from the chip. An outboard end of each beam lead, remote from the chip, is embedded in a mass 1142 of a fusible conductive material as discussed above, and electrically connected through such mass to a contact 1164 on a substrate 1168. Thus, each beam lead is electrically connected in series with a mass of the fusible conductive material to form an electrical interconnection between the chip and substrate. The beam leads and fusible masses are covered by a mass of soft, compliant dielectric encapsulant 1154 which intimately surrounds and protects the fusible masses. In this embodiment as well, the contacts 1124 of the chip or first element 1122 are electrically connected to the contacts 1164 of the substrate or second element 1168. When the assembly is exposed to high temperatures, the fusible material melts, allowing beam leads 1125 to move relative to the substrate. This action relieves stress on the beam leads and on the connections between the beam leads and the contacts 1124 of the first element. Here again, the surrounding compliant dielectric material 1154 contains the liquid masses 1124 and maintains them electrically isolated from one another. Other physical configurations may be used, provided that the contacts of the elements are electrically connected to one another through masses of liquid or fusible material, and provided that the fusible masses are contained by the surrounding compliant dielectric material. For example, the fusible masses may be used in conjunction with flexible leads as taught in the aforementioned U.S. Pat. Nos. 5,148,265; 5,148,266; 5,455,390 and International Publication WO 96/02068, the disclosures of which are hereby incorporated by reference herein. Indeed, a fusible material as referred to herein may serve as a bonding material for connecting the flexible leads as taught in these documents to a microelectronic element.

Figure 22:
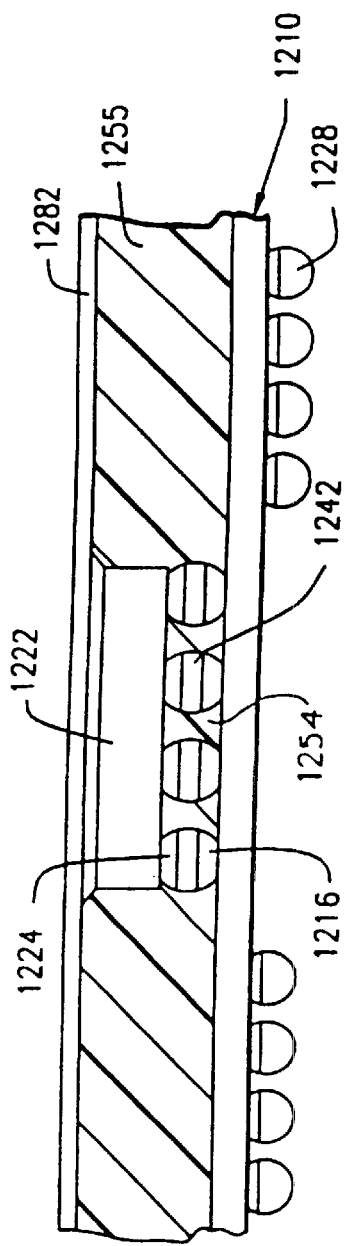
FIG. 22 is a diagrammatic sectional view depicting an assembly in accordance with yet another embodiment of the invention.

Referring to FIG. 22, an assembly in accordance with a further embodiment of the invention provides a chip package including a rigid panel 1210 such as a conventional fiber reinforced epoxy panel of the type commonly referred to as a "FR-4" circuit board or a ceramic circuit panel; a chip 1222 disposed above the panel and a combined thermal spreader and protective shield 1282 formed from a metal or a metal compound such as aluminum nitride disposed above the chip. The chip contacts 1224 are electrically connected to panel contacts 1216 by masses of fusible conductive material 1242 in the manner discussed above. The masses of fusible material are surrounded by a compliant material 1254 forming a layer between the chip and panel. Further portions 1255 of the compliant material fill the space around the chip, between the shield 1282 and the panel 1210. Panel contacts 1216, and hence the chip contacts, are electrically connected to terminals 1228 by leads on the panel (not shown). Terminals 1228 include solder balls for mounting the packaged chip to a larger circuit panel.

Figure 23:
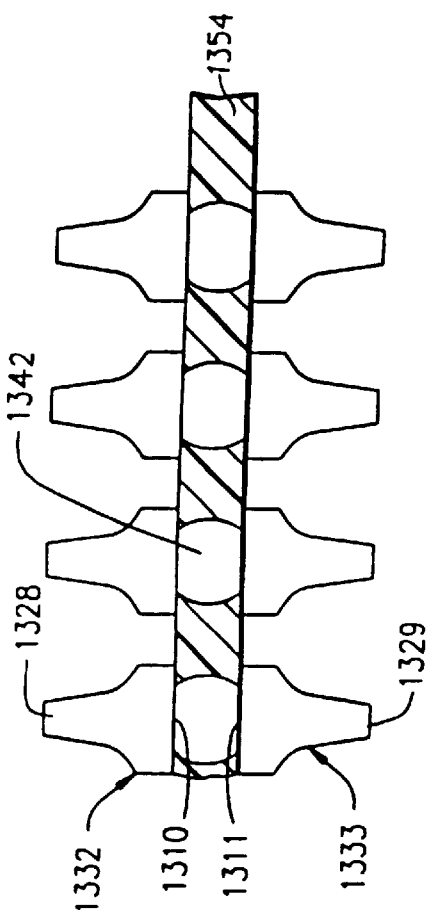
FIG. 23 is a fragmentary diagrammatic sectional view depicting an assembly in accordance with a further embodiment of the invention.

Yet another embodiment of the invention provides a connector (FIG. 23) similar to that discussed above with reference to FIG. 8 having terminal assemblies similar to those discussed above with reference to FIGS. 14–17 on both surfaces. The connector thus includes a layer 1354 of compliant material having first terminal assemblies 1332 on a first surface. Each first terminal assembly defines a contact surface 1310 facing toward the compliant layer and a terminal 1328 facing away from the compliant layer. Similarly, second terminal assemblies 1333 on the second surface of layer 1354 define contact surfaces 1311 facing toward the compliant layer and terminals 1329 facing away from the compliant layer. Masses 1342 of fusible material extend between the contact surfaces and electrically interconnect each first terminal with a second terminal. A connector of this type may be connected between a pair of microelectronic elements to provide an assembly as discussed above. The connector can be fabricated by a process as discussed above with reference to FIGS. 12–15, utilizing two metallic plates. The fusible masses are provided between the metallic plates, followed by formation of the compliant layer between the plates. After the compliant layer is formed, both metallic plates are subdivided, as by etching, to form the separate terminal assemblies.

Figure 24:
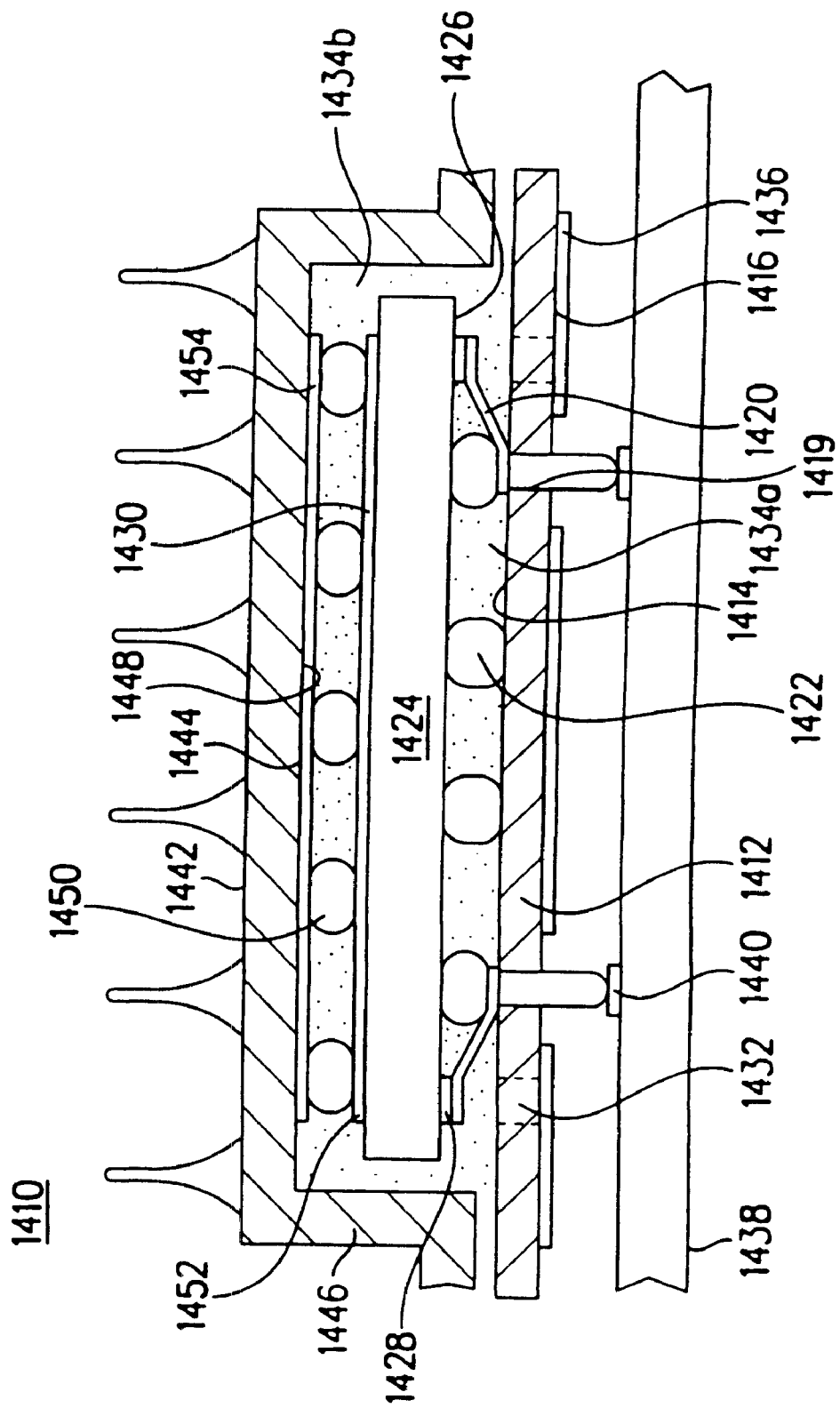
FIG. 24 is a diagrammatic sectional view of an assembly in accordance with another embodiment of the invention.

Still another embodiment of the present invention provides a microelectronic package as shown in FIG. 24. The microelectronic package 1410 includes a first microelectronic element such as a semiconductor chip 1424 which has a generally planar front surface 1426 including electrical parts or contacts 1428 formed on peripheral regions of the front face 1426. A second microelectronic element or circuit element 1412 is provided in the form of a sheet-like dielectric film 1412 having a first surface 1414 and a second surface 1416. The dielectric film 1412 has electrically conductive parts including conductive terminals 1418. Although terminals 1418 are physically disposed on the first surface 1414 of the sheet, they are accessible at the second surface 1416 for connection through vias 1419 extending through the sheet. The second microelectronic element or sheet 1412 overlies the front or contact-bearing surface of chip 1424, so that these elements define a front space 1434 therebetween. A plurality of thermally conductive fusible masses 1422, formed from fusible materials as discussed above, are disposed in the front space 1434a. A compliant dielectric material fills front space 1434a, and surrounds masses 1422 as discussed above. However, masses 1422 do not electrically connect the chip with terminals 1418. Rather flexible leads 1420 extending from the terminals 1418 electrically connecting the terminals to the contacts 1428 of the chip. These flexible leads may be provided by conventional processes such as wire bonding, or else may be formed by processes in as shown in U.S. Pat. Nos. 5,398,863; 5,390,844; 5,536,909 and 5,491,302, utilizing leads which are initially formed on the flexible sheet. The leads may be connected to contacts 1428 before the compliant material is applied in the front space, while fusible masses 1422 are in a solid state and the sheet is supported above the surface of chip 1424 by masses. As discussed in the aforementioned patents, the leads may initially extend across a bond window 1432 in the sheet, and the bond window may be sealed by a mask or coverlay 1436 prior to introduction of the compliant material.

The semiconductor chip 1424 also has a rear surface 1430 which faces away from the front surface 1426 and faces away from dielectric film 1412. In order to dissipate heat from the chip 1424, as well as support and protect the chip 1424, a third microelectronic element 1442 which is a package element, such as a heat sink, is provided. Third element or heat sink 1442 includes a back wall 1444 and side walls 1446 forming a unitary shell and surrounding the chip 1424. The dielectric sheet 1412 extends across the front of the heat sink 1442. The heat sink 1442 has a central region 1448 confronting the rear surface 1430 of the chip 1424. Thus, the first element or chip 1424 is sandwiched between the second element or dielectric sheet 1412 and the third element—the package element or heat sink 14442. A rear space 1434b is defined between the surface of central region 1448 of the third element or heat sink 1442 and the rear surface of the first element 1430 Masses of a fusible conductive material 1450 are disposed in this rear space, between the rear face 1430 of the semiconductor chip 1424 and the central region 1448 of the heat sink 1442 to provide heat or thermal conductance between the chip 1424 and the heat sink 1442. The thermally conductive material incorporated in the masses 1450 comprises an ultra-low melting point solder which is similar to the fusible conductive material described above in reference to FIGS. 1–23. Thermally conductive masses 1450 may be positioned in the rear space by depositing them on the surface of the heat sink or on the rear surface of the chip before assembling these elements. For example, the heat sink, with the masses thereon in a molten condition, may be assembled to the back of the chip. This may be performed before or after assembly of the dielectric sheet or first element and the chip.

A barrier layer 1452, similar to the barrier layers described above, may be disposed between the rear face 1430 of the semiconductor chip 1424 and the fusible conductive masses 1450. The barrier metal layer 1452 is preferably wettable by the fusible conductive masses 1450 when the latter is in its liquid state. The barrier metal may be formed as spots which are coextensive with each fusible conductive mass so that the fusible conductive masses, when in the liquid state, will only wet to the spots. Alternatively, the barrier metal may be provided as a contiguous layer which substantially covers the rear face 1430 of the chip 1424. When the barrier metal is formed as a contiguous layer, then a non-wettable solder mask or screen should be employed to contain the masses in place and separate from one another when the masses are in a molten condition. Barrier layer 1452 may also act to block alpha radiation from the masses As discussed above, the barrier layer composition should be selected to prevent diffusion of the barrier metal into the chip 1424 and/or to prevent contamination of the thermally conductive masses by the material of the chip 1424. Selection of an appropriate barrier metal will assure that the composition of the fusible conductive masses 1450 will remain essentially unchanged and hence its melting temperature will not vary during continued use of the device. If the material of the heat sink is not compatible with the fusible material, a second barrier layer 1454 may also be disposed between the heat sink 1442 and the fusible conductive masses 1450 to avoid the problems set forth above.

After the fusible conductive masses 1450 and 1422 have been disposed in the front and rear spaces as discussed above, the fusible conductive masses are surrounded by a curable liquid which fills the front space 1434a and which also fills the rear space 1434b. Thus, a single flowable material, such as a curable liquid is introduced simultaneously into the front and rear spaces, and forms compliant layers in both of these spaces. This material is then cured to form the compliant layers. Desirably, the cured compliant material also extends between the edges of the chip and the side walls 1446 of the package element, so that the compliant material encapsulates the chip 1424. The compliant material desirably also encapsulates the flexible leads 1420. The encapsulant used to form the compliant layer should be capable of flowing, prior to cure, at temperatures below the melting temperature of the fusible conductive masses 1450 and 1422. To insure complete filling of the spaces by the flowable material, the flowable material may be injected under pressure.

The assembly described above may be incorporated in an electronic device such as a computer or communications device by connecting the terminals 1418 of the semiconductor package 1410 to contacts 1440 on the substrate 1438. To facilitate such connection, sheet 1412 and particularly terminals 1418 on the sheet desirably are coplanar or substantially coplanar. Such planarity can be provided by engaging the sheet or first element 1412 with a planar platen (not shown) and forcing it towards the package element or heat sink 1442 while masses 1422 in the front space, and preferably rear-space masses 1450 as well are in a molten condition. This also causes compression of the compliant materials in the front and rear spaces. A planarization process may also occur during bonding of the terminals to a substrate, as during a surface mounting operation. Thus, under the conditions used for surface mounting, the molten masses 1422 and the soft compliant layer allow the terminals and sheet to move into engagement with the contact pads 1440 of the substrate.

During operation as the assembly is heated and cooled, each contact 1428 on the chip 1424 typically moves with respect to the corresponding contact 1440 on the substrate 1438. Also, the chip 1424, the substrate 1438 or both can warp as they undergo thermal expansion and contraction. Because the terminals 1418 on the dielectric film 1412 are bonded to the contacts 1440 of the substrate 1438, the dielectric film terminals 1418 will also tend move relative to the contacts 1428 on the chip 1424. At operating temperature, however, the masses 1422 are molten. The compliant layer in the front space 1434a, and the molten masses 1422 can accommodate substantial movement of the chip 1424 relative to the dielectric film 1412 and terminals 1418 without applying high forces between these elements. The flexible leads provide electrical interconnection while still permitting such movement. Masses 1422 will provide good heat transfer from the chip 1424 to dielectric sheet 1412 and thus to the substrate 1438. Also, thermal effects will cause movement of chip 1424 relative to the heat sink 1442. The molten thermally conductive masses, in conjunction with the compliant layer in rear space 1434b will allow such movement while still providing effective heat transfer between the chip and the heat sink.

In an assembly according to a further embodiment of the invention, the thermally conductive masses 1422 in the front space are omitted. In this case, a compliant layer may be provided in the front space to mechanically decouple the dielectric sheet 1412 from the chip. Such a compliant layer may be formed by providing compliant posts (not shown) on the dielectric sheet to support the sheet on the chip, and injecting a compliant material around these posts, or else may be formed or assembled on the sheet before assembly of the sheet to the chip.

Figure 25:
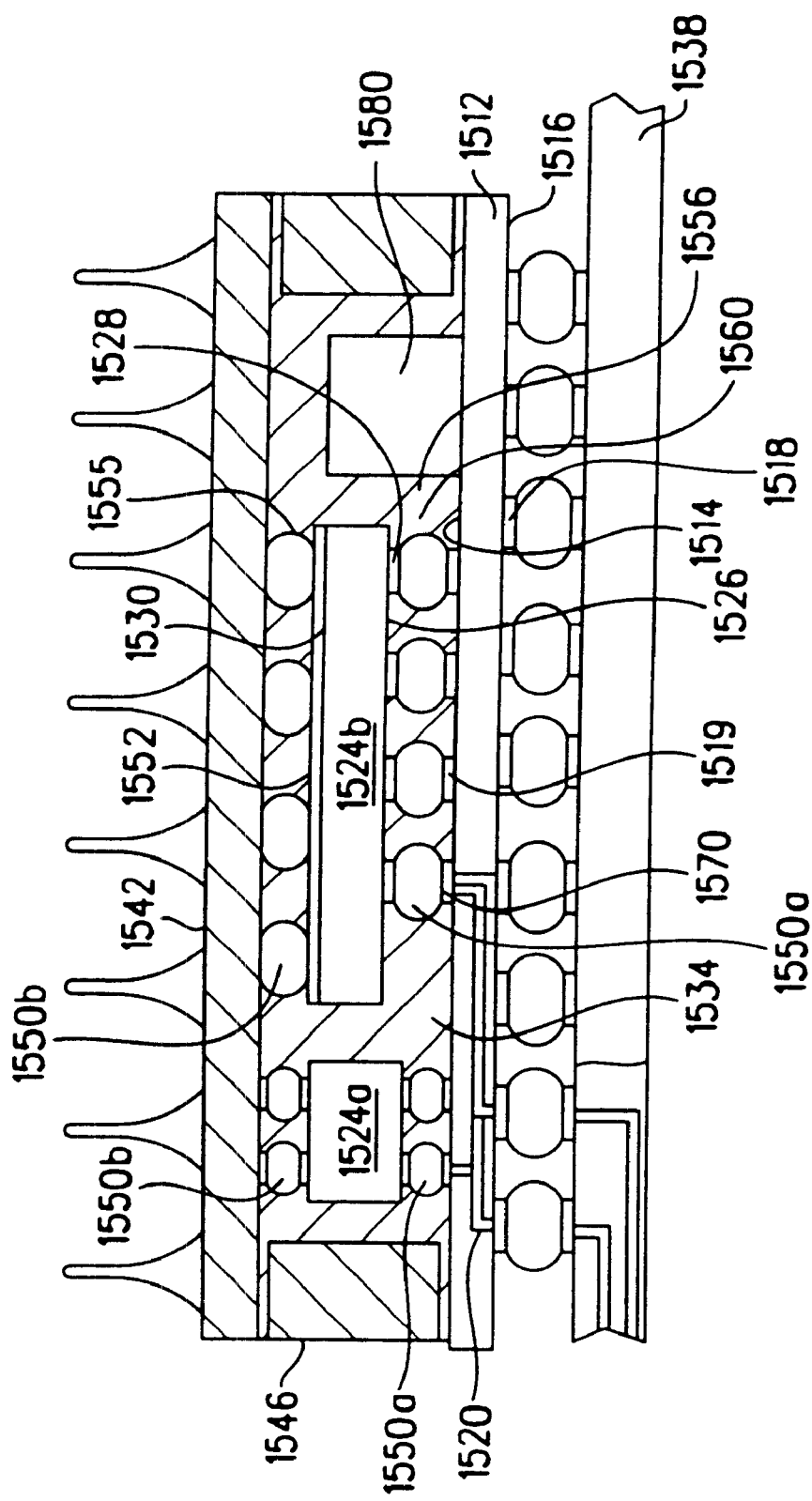
FIG. 25 is a diagrammatic sectional view of an assembly in accordance with still another embodiment of the present invention.

As shown in FIG. 25, an assembly and method in accordance with yet further embodiments of the invention provides a multichip module. The assembly comprises a first element which includes plural semiconductor chips 1524a and 1524b. A second element 1512 includes a flexible dielectric sheet having a first surface 1514 facing inwardly toward the chips 1524 and a second surface 1516 facing away from the chips. The flexible dielectric sheet 1512 has contacts 1519 on the first surface 1514, and has terminals 1518 disposed on the second surface 1516 and hence accessible at the second surface. The contacts 1519 on the dielectric sheet 1512 are disposed in a pattern corresponding to the pattern of contacts 1528 on the chips 1524; however, the contacts 1519 are not integral with the terminals 1518. Instead, the terminals 1518 are distributed on the second surface 1516 of the sheet 1512 in an array different from the pattern of contacts 1519 and may occupy a larger area of the sheet 1512 than do the contacts 1519. The terminals 1518 are connected to the contacts 1519 by traces 1520 extending within the sheet 1512. Thus, the sheet 1512 may be a multilayer structure, with the traces 1520 disposed between layers as well as on the surfaces of the structure. The assembly further includes additional electrical elements 1580 mounted to the sheet 1512 and electrically connected to the leads 1520, so that the additional elements 1580 are connected between some of the contacts 1519 and the terminals 1518. The additional elements 1580 may include any common circuit element, but most typically include capacitors. The capacitors typically are connected to the terminals 1518 and the contacts 1519 which form the power and ground connections to the chips 1524. Traces 1520 electrically interconnect chips 1524a and 1524b with one another, and with additional electrical elements 1580.

The assembly according to this particular embodiment further comprises a third microelectronic element in the form of a package element 1542 which serves to dissipate heat from the chips 1524 as well as to physically support and protect the chips 1524. The package element is depicted schematically as a heat sink 1542 defining a back wall and a separate ring 1546 surrounding the chips 1524 and the additional circuit elements 1580. The dielectric sheet 1512 extends across the front of the package element, and overlies the ring 1546. The heat sink 1542 has a central region 1544 confronting the rear face 1530 of the chips 1524. Masses of a fusible, thermally conductive material 1550b extend between the rear faces 1530 of the chips 1524 and the central region 1544 for providing thermal conductance between the chips 1524 and the heat sink 1542. The thermally conductive masses 1550b typically comprise substantially identical materials as described above. The thermally conductive masses 1550b may be larger in diameter than the electrically conductive masses 1550a, and each thermally conductive mass 1550b may cover a substantial portion of the rear surface 1530 of the a chip.

The thermally conductive masses 1550b may also be surrounded by a compliant layer 1555 which is substantially similar to the compliant layer 1556 surrounding the electrically conductive masses 1550a. The compliant layers between the chips 1524 and the dielectric sheet 1512 and between the rear face 1530 of the chips 1524 and the heat sink 1542 may be formed from the same materials, and both such layers may be formed integrally with the flowable material 1534 filling the space cooperatively enclosed by the heat sink 1542, the ring 1546 and the dielectric sheet 1512.

In one method of manufacture, masses of a fusible, electrically conductive material 1550a, such as the ultra-low melting point solder described above, are deposited on the contacts 1528 of the chips 1524, as described above. In the next stage of the process, the dielectric sheet 1512 is assembled to the chips 1524 so that the first surface 1514 of the dielectric sheet 1512 faces toward the front faces 1526 of the chips 1524 and these confronting surfaces define front space 1560 between them. The contacts 1519 of the dielectric sheet 1512 are aligned with the contacts 1528 of the chips 1524 and aligned with the electrically conductive masses 1550a disposed on the chips contacts 1528.

While the dielectric sheet 1512 and the chips 1524 are aligned with one another, the sheet 1512 is pressed toward the chips 1524 so that the exposed surfaces of the contacts 1519 on the first surface 1514 of the sheet 1512 engage the electrically conductive masses 1550a. While the contacts 1519 and 1528 are held in engagement with the electrically conductive masses 1550a, the conductive masses 1550a are brought to a temperature above their melting temperature, so that the conductive material at least partially liquefies and flows into intimate engagement with the exposed surfaces of the contacts 1519 on the dielectric sheet 1512.

While the masses 1550a are in at least a partially molten condition, the sheet 1512 and hence the terminals 1518 are held in a substantially planar condition so that the terminals 1518 on the second surface 1516 of the dielectric sheet 1512 are in substantially coplanar alignment with one another. While the terminals 1518 are aligned in this manner, the electrically conductive masses 1550a are cooled to below their melting temperature.

After the electrically conductive masses 1550a have been completely frozen, a flowable, preferably liquid material or encapsulant 1534a is allowed to flow into the front space 1560 between confronting surfaces 1514 and 1526 so that the flowable material 1534a fills the space 1560 and intimately surrounds the electrically conductive masses 1550a and the surfaces adjacent contacts 1519 and 1528. During introduction of the flowable material 1534a, the contacts 1519 and the sheet 1512 are maintained in substantially planar disposition, and the contacts 1519 are maintained in alignment with the electrically conductive masses 1550a. After the front space 1560 has been completely filled by the flowable material 1534a, the flowable material is cured to form a compliant resilient layer 1556 occupying the space 1560 and intimately surrounding the electrically conductive masses 1550a and contacts 1519 and 1528, as described above.

Next, thermally conductive masses 1550b and heat sink 1542 are assembled to the rear surfaces of the chips. Here again, the conductive masses are melted momentarily during the assembly process, so that the thermally conductive masses bond to the rear surfaces of the chips and to the heat sink. After these elements have been added, and preferably after the thermally conductive masses 1550b are frozen, a further flowable material is added to fill the rear space 1555 between the chip rear surfaces and the heat sink. The reverse process may also be employed, in which the chips 1524 are first assembled to the heat sink 1542 and compliant layer 1555 is formed, followed by assembly of the sheet 1512 and the electrically conductive masses 1550a and formation of compliant layer 1556 between the chips 1524 and the dielectric sheet 1512. Here again, the flowable material used to form both front and rear compliant layers may be applied simultaneously.

The assembly can be handled and mounted using ordinary surface-mounting techniques. In one embodiment, the terminals 1518 on the dielectric sheet 1512 are bonded to the contacts 1540 on the substrate 1538 to form electrical connections between the chips 1524 and other devices. Additional packaging may also be provided around the chips 1524 and the substrate 1538. For example, the chips 1524 and the substrate 1538 may be encapsulated in a flexible encapsulant which may also flow between the dielectric sheet 1512 and the substrate 1538.

In this embodiment as well, masses 1550a and 1550b melt during operation, and offer essentially resistance to mechanical deformation. The only mechanical interconnection between the chips 1524 and the flexible, dielectric sheet 1512, and hence the only mechanical interconnection between the chips 1524 and substrate 1538, is provided by the compliant layer. This compliant layer can accommodate substantial movement of the chips 1524 relative to the dielectric sheet 1512 without applying high forces between these elements. Similarly, the thermally conductive masses 1550b will melt, but will be contained by the compliant layer 1555 to provide a highly conductive but highly compliant, flexible thermal pathway between the chips 1524 and the heat sink 1542. When power to the system is turned off, the device cools and the electrically conductive masses 1550a and/or the thermally conductive masses 1550b may freeze again. The cycle of melting and freezing may be repeated numerous times during the service life of the device.

In an alternative embodiment, the melting temperature of the thermally conductive masses 1550b may be different than that of the electrically conductive masses 1550a. The higher temperature melting masses are placed first and frozen. The lower temperature melting masses are then placed and melted while the higher temperature melting masses hold the chips 1524 in position relative to the heat sink 1542 or relative to the dielectric sheet 1512. After both sets of fusible conductive masses have been frozen, the flowable material is introduced and cured to form compliant layers 1555 and 1556 simultaneously. The flowable material may then be cured to provide a unitary, homogenous compliant layer between the package element and the dielectric sheet.

As these and other variations and combinations of the features discussed above can be employed, the foregoing description of the preferred embodiments should be taken by way of illustration rather than by way of limitation of the invention as defined by the claims.

What is claimed is:

1. A microelectronic package comprising:
   (a) a first microelectronic element having a front surface including contacts and a rear surface, said first microelectronic element being operable in a range of operating temperatures;
   (b) a package element having a surface confronting the rear surface of said microelectronic element;
   (c) a first layer of a compliant material having top and bottom surfaces extending in lateral directions between said confronting surfaces of said first microelectronic element and said package element;
   (d) one or more masses of a thermally conductive material dispersed in said first compliant layer so that said thermally conductive masses are spaced apart from one another in lateral directions, said thermally conductive masses having a melting temperature within or below the range of operating temperatures of said first microelectronic element, each said thermally conductive mass being adjacent to said confronting surfaces of said first microelectronic element and said package element for transferring heat therebetween during operation of said first microelectronic element; and
   (e) a second microelectronic element overlying said front surface of said first microelectronic element so that said first microelectronic element is disposed between said package element and said second microelectronic element, said second microelectronic element being electrically connected to said first microelectronic element.

2. A package as claimed in claim 1, wherein said second microelectronic element has a contact bearing surface confronting the contact bearing front surface of said first microelectronic element; , the package further comprising:
   a second layer of a compliant material having top and bottom surfaces extending in lateral directions between said confronting surfaces of said first and second microelectronic elements;
   one or more masses of a fusible electrically conductive material dispersed in said second compliant layer so that said electrically conductive masses are spaced apart from one another and extend between contacts of said first and second microelectronic elements, said electrically conductive masses having a melting temperature within or below said range of operating temperatures.

3. A package as claimed in claim 2, wherein said first and second compliant layers are contiguous with one another.

4. A package as claimed in claim 2, wherein said thermally conductive material and said electrically conductive material comprise one or more metals.

5. A package as claimed in claim 1, wherein said second microelectronic element includes a flexible dielectric sheet having a first surface confronting the contact bearing front surface of said first microelectronic element and a second surface facing away from said first microelectronic element, said flexible dielectric sheet including conductive terminals and accessible at said second surface, the package further comprising flexible leads electrically connected between said conductive terminals said contacts of said first microelectronic element for electrically interconnecting said first and second microelectronic elements.

6. A package as claimed in claim 5 further comprising:

a second layer of a compliant material having top and bottom surfaces extending in lateral directions between said confronting surfaces of said first and second microelectronic elements;

one or more masses of a thermally conductive fusible material dispersed in said second compliant layer so that said thermally conductive masses are spaced apart from one another in lateral directions, said thermally conductive masses having a melting temperature within or below the range of operating temperatures of said first and second microelectronic elements, each said mass of thermally conductive material having opposite ends adjacent to said confronting surfaces of said first and second microelectronic elements for conducting heat therebetween.

7. A package as claimed in claim 1, wherein said first microelectronic element includes one or more semiconductor chips.

8. A package as claimed in claim 1, wherein said package element includes a heat sink.

* * * * *